(12) United States Patent
Nakano et al.

(10) Patent No.: US 9,318,513 B2
(45) Date of Patent: Apr. 19, 2016

(54) SEMICONDUCTOR DEVICE, ACTIVE MATRIX BOARD, AND DISPLAY DEVICE

(75) Inventors: Fumiki Nakano, Osaka (JP); Tadayoshi Miyamoto, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/113,289

(22) PCT Filed: Apr. 20, 2012

(86) PCT No.: PCT/JP2012/060737
§ 371 (c)(1),
(2), (4) Date: Oct. 22, 2013

(87) PCT Pub. No.: WO2012/147657
PCT Pub. Date: Nov. 1, 2012

(65) Prior Publication Data
US 2014/0048812 A1    Feb. 20, 2014

(30) Foreign Application Priority Data
Apr. 28, 2011    (JP) ................................. 2011-101100

(51) Int. Cl.
*H01L 21/00*    (2006.01)
*H01L 29/786*    (2006.01)
*H01L 27/12*    (2006.01)
(Continued)

(52) U.S. Cl.
CPC ...... *H01L 27/1255* (2013.01); *G02F 1/136209* (2013.01); *G09G 3/3208* (2013.01); *G09G 3/3648* (2013.01); *H01L 29/78633* (2013.01); *H01L 29/78648* (2013.01); *H04N 1/00* (2013.01); *G09G 2300/0814* (2013.01); *G09G 2300/0852* (2013.01); *G09G 2300/0876* (2013.01); *G09G 2310/0259* (2013.01); *G09G 2310/066* (2013.01); *G09G 2320/0214* (2013.01); *G09G 2320/041* (2013.01); *G09G 2340/0435* (2013.01); *G09G 2360/144* (2013.01); *H01L 27/326* (2013.01); *H01L 27/3272* (2013.01)

(58) Field of Classification Search
CPC .................................................. H01L 27/1255
USPC ........................................................ 257/71
See application file for complete search history.

(56) References Cited

U.S. PATENT DOCUMENTS 5,650,636 A    7/1997    Takemura et al.
2005/0078076 A1*    4/2005    Kim et al. ........................ 345/98
(Continued)

FOREIGN PATENT DOCUMENTS

JP    H4-251818 A    9/1992
JP    7-333653 A    12/1995
(Continued)

*Primary Examiner* — Matthew Landau
*Assistant Examiner* — Igwe U Anya
(74) *Attorney, Agent, or Firm* — Chen Yoshimura LLP

(57) ABSTRACT

Provided is a semiconductor device equipped with: a plurality of switching elements (T1, T2) that are connected in series; a first capacitance (Cs1) having one electrode connected to an end of the plurality of switching elements (T1, T2) and another electrode being connected to a first capacitance wiring line (CSL1); a second capacitance (Cs2) with one electrode connected to a node that connects two adjacent switching elements (T1, T2) among the plurality of switching elements, and another electrode being connected to a second capacitance wiring line (CSL2); and a light-shielding film that block light from being incident on at least one of the plurality of switching elements (T1, T2).

5 Claims, 14 Drawing Sheets

(51) Int. Cl.
*H04N 1/00* (2006.01)
*G09G 3/36* (2006.01)
*G09G 3/32* (2006.01)
*G02F 1/1362* (2006.01)
*H01L 27/32* (2006.01)

(56) References Cited

U.S. PATENT DOCUMENTS

| | | | |
|---|---|---|---|
| 2005/0270433 A1* | 12/2005 | Ohue et al. | 349/38 |
| 2007/0115229 A1* | 5/2007 | Takatori et al. | 345/87 |
| 2008/0079685 A1* | 4/2008 | Umezaki et al. | 345/100 |
| 2008/0084365 A1* | 4/2008 | Takahara | G09G 3/006 345/76 |
| 2008/0136984 A1* | 6/2008 | Yokoyama et al. | 349/38 |
| 2009/0002585 A1* | 1/2009 | Shimoshikiryoh et al. | 349/39 |
| 2010/0014012 A1* | 1/2010 | Irie et al. | 349/39 |
| 2010/0128054 A1 | 5/2010 | Manabe | |
| 2012/0320004 A1* | 12/2012 | Kitakado | 345/204 |

FOREIGN PATENT DOCUMENTS

| | | |
|---|---|---|
| JP | 8-46204 A | 2/1996 |
| JP | 8-328515 A | 12/1996 |
| JP | 2001-91973 A | 4/2001 |
| JP | 2007-140310 A | 6/2007 |
| JP | 2009-115883 A | 5/2009 |
| JP | 2009-224884 A | 10/2009 |
| JP | 2010-122609 A | 6/2010 |
| WO | WO 2011083598 A1 * | 7/2011 |

* cited by examiner (a)

(b)

(c)

(a)

(b)

(c)

SEMICONDUCTOR DEVICE, ACTIVE MATRIX BOARD, AND DISPLAY DEVICE

TECHNICAL FIELD

The present invention relates to a semiconductor device provided with a switching element such as a transistor, an active matrix substrate using this semiconductor device, and a display device, for example.

BACKGROUND ART

Recent flat-panel displays such as liquid crystal display devices, for example, have features such as being thinner and lighter than conventional cathode-ray tube displays. This is the reason flat-panel displays are widely used in liquid crystal televisions, monitors, mobile phones, and the like. A liquid crystal panel in such a liquid crystal display device uses an active matrix substrate whereupon a plurality of data wiring lines (also called source electrode wiring lines or signal lines) and a plurality of scanning wiring lines (gate electrode wiring lines or gate lines) are arranged in a matrix. Pixels that each have a switching element such as a thin-film transistor (abbreviated as a "TFT"), which is provided in the vicinity of each intersection between the data wiring lines and scanning wiring lines, and a pixel electrode connected to this switching element, are arranged in a matrix on the active matrix substrate.

To reduce power consumption for a display device provided with the switching element in each pixel in this way, it is effective to lower the driving frequency. However, if the driving frequency is lowered in the liquid crystal panel, the voltage holding period of the liquid crystal pixel becomes longer, resulting in failure to hold the voltage to be applied to the liquid crystal pixel during the holding period, and thus causing display anomalies. Therefore, it is difficult to lower the driving frequency without a drop in display quality.

A configuration of a TFT has been proposed that suppresses the change in voltage of the liquid crystal pixels. This configuration has one end of a liquid crystal pixel connected to a signal line via each drain/source of two TFTs connected in series, and each gate of these two TFTs is connected to a gate line (see Patent Document 1, for example). In this conventional technology, one end of an auxiliary capacitance is connected to the connecting point between these two TFTs, and the other end of the auxiliary capacitance, and the other end of the liquid crystal pixel are respectively grounded. This configuration allowed for a suppression of the change in liquid crystal pixel voltage caused by leakage current when the TFT is non-conductive.

RELATED ART DOCUMENT

Patent Document

Patent Document 1: Japanese Patent Application Laid-Open Publication No. H4-251818

SUMMARY OF THE INVENTION

Problems to be Solved by the Invention

The present invention aims at providing a semiconductor device capable of effectively suppressing leakage current, with a configuration in which a plurality of switching parts are connected in series and a capacitance is connected to each connecting part of the switching elements, an active matrix substrate using this semiconductor device, and a display device.

Means for Solving the Problems

A semiconductor device in one embodiment of the present invention has: a plurality of switching elements that are connected in series; a first capacitance having one electrode connected to an end of the plurality of switching elements and another electrode being connected to a first capacitance wiring line; a second capacitance having one electrode connected to a node that connects two adjacent switching elements among the plurality of switching elements, and another electrode being connected to a second capacitance wiring line; and a light-shielding film that blocks light from being incident on at least one of the plurality of switching elements.

Effects of the Invention

According to the embodiments of the present invention, a semiconductor device that can effectively suppress leakage current even when a plurality of switching parts are connected in series and when a capacitance is connected to the connecting part of the switching parts, an active matrix substrate using this semiconductor device, and a display device can be provided.

DETAILED DESCRIPTION OF EMBODIMENTS

Figure 1:
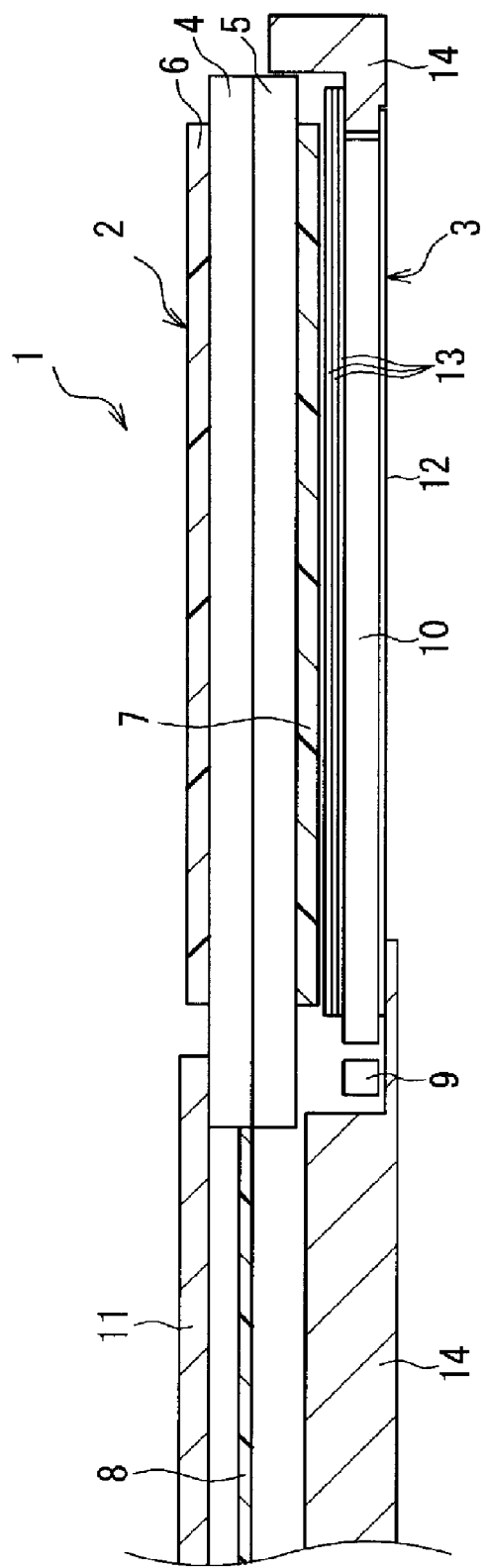
FIG. 1 is a view showing a liquid crystal display device of Embodiment 1 of the present invention.

A semiconductor device in one embodiment of the present invention has: a plurality of switching elements that are connected in series; a first capacitance having one electrode connected to an end of the plurality of switching elements and another electrode being connected to a first capacitance wiring line; a second capacitance having one electrode connected to a node that connects two adjacent switching elements among the plurality of switching elements, and another electrode being connected to a second capacitance wiring line; and a light-shielding film that blocks light from being incident on at least one of the plurality of switching elements.

In the semiconductor device described above, a light-shielding film that blocks light from being incident on at least one of the plurality of switching elements is formed. This makes it possible to prevent leakage current from occurring due to light.

In the semiconductor device, one end of a plurality of switching elements is connected to a first capacitance wiring line via a first capacitance, and a second capacitance wiring line is connected to a connecting point between the adjacent switching elements via a second capacitance. With this configuration, a voltage between adjacent switching elements can be controlled independently from a voltage on an end of the plurality of switching elements. Therefore, using the second capacitance wiring line and second capacitance to control the voltage between the adjacent switching elements makes it possible to suppress changes in voltage caused by leakage current of the switching elements provided between the first capacitance and second capacitance.

Unlike in the conventional technology, the above results in a semiconductor device in which it is possible to reliably suppress leakage current and changes in voltage on one end of the plurality of switching elements, even when the plurality of switching elements are connected in series and capacitances are connected to the connecting points of the switching elements.

In the conventional technology, it was difficult to sufficiently suppress leakage current when the driving frequency was lowered, for example. When the driving frequency is lowered in liquid crystal panels that use low temperature polysilicon TFTs as switching elements, voltage to be applied to the liquid crystal during the holding period is not able to be held anymore, resulting in display anomalies.

In the conventional technology described above, a voltage of a connecting point of two switching parts SW1 and SW2 gradually changes due to the off-leakage current of SW1 as driving frequency is lowered and the holding period becomes longer. This happens even when the two switching parts SW1 and SW2 are connected in series and a capacitance is connected to the connecting point therebetween. Thus the off-leakage current of SW2 increases with time, leading to a change in the voltage applied to the liquid crystal. Accordingly, operating with a very low driving frequency is difficult.

As a countermeasure, the embodiments of the present invention can reliably suppress leakage current even when the plurality of switching parts are connected in series and capacitances are connected to the connecting points of the switching elements. Thus, changes in voltage of one end of the plurality of switching elements can be suppressed.

In the semiconductor device in the embodiments of the present invention, when each switching element connected between the first capacitance and the second capacitance is OFF, a voltage of the second capacitance wiring line is changed such that a difference in potential between the one electrode of the first capacitance and the one electrode of the second capacitance is reduced. This makes it possible to reduce the difference in potential between the one electrode of the first capacitance and the one electrode of the second capacitance and to suppress changes in voltage of one end of the plurality of switching elements caused by leakage current by controlling the second capacitance wiring line.

The semiconductor device can be configured such that when each switching element between the first capacitance and second capacitance is OFF, the voltage of the second capacitance wiring line is changed such that a voltage on the one electrode of the second capacitance becomes higher than a voltage on the one electrode of the first capacitance. This makes it possible, when the corresponding switching elements are OFF, to reduce the difference in potential when the voltage on the one electrode of the second capacitance becomes lower than that on the one electrode of the first capacitance due to leakage current or the like.

The semiconductor device can be configured such that when each switching element between the first capacitance and the second capacitance is OFF, the voltage on the one electrode of the second capacitance is lower than the voltage on the one electrode of the first capacitance in the switching element, immediately before a voltage of the second capacitance wiring line is changed. This allows for the difference in potential between the one electrode of the first capacitance and the one electrode of the second capacitance to be reduced by changing the voltage of the second capacitance wiring line when the voltage on the one electrode of the second capacitance becomes lower than the voltage on the one electrode of the first capacitance due to leakage current or the like.

The semiconductor device can be configured such that when each switching element between the first capacitance and the second capacitance is OFF, a voltage of the second capacitance wiring line is changed two or more times at set intervals during which each above-mentioned switching element is OFF. By changing the voltage at set intervals, the change in amount of voltage each time can be made equal, and adjusting the voltage of the second capacitance wiring line can be simplified, for example.

The semiconductor device can be configured such that when each switching element between the first capacitance and the second capacitance is OFF, the voltage of the second capacitance wiring line is changed in the same amount two or more times. This makes it possible to simplify adjusting the voltage of the second capacitance wiring.

The semiconductor device can have an aspect in which the semiconductor device is placed alongside another semiconductor device, and in which the second capacitance wiring line of the semiconductor device is connected to each switching element of the other adjacent semiconductor device, the second capacitance wiring line also acting as a wiring line that supplies a control signal to each switching element. By doing this, it is possible to reduce the number of wiring lines. The other semiconductor device can have a similar configuration to the semiconductor device described above.

As one of the embodiments, the semiconductor device can have an aspect in which the semiconductor device is provided in each pixel of an active matrix substrate, and in which a pixel electrode is connected to one end of the plurality of switching elements and a signal line is connected to the other end, the signal line supplying a pixel signal via the plurality of switching elements.

As such, by providing the semiconductor device in each pixel of the active matrix substrate, the charge written to the pixel electrode via the switching elements can be suppressed from being lost over time due to leakage current. As a result, the driving frequency of a display device using an active matrix substrate and power consumption can be reduced, and a favorable display can be maintained.

In the semiconductor device of the active matrix substrate, it is preferable that when the pixel signal is being supplied to the pixel electrode from the signal wiring line, the corresponding switching elements turn ON, and that the voltage of the second capacitance wiring line be changed such that a difference in potential between the pixel electrode and the signal line becomes smaller during a holding period, the holding period being a time in which the corresponding switching elements are OFF and a voltage of the pixel electrode is held. This allows for suppression of changes in voltage of the pixel electrode caused by leakage current during the holding period, the holding period being a time in which a voltage of the pixel electrode is held.

In the semiconductor device provided in the active matrix substrate, a configuration is possible in which when the pixel signal is being supplied to the pixel electrode from the signal line, the corresponding switching elements turn ON, and in which the voltage of the second capacitance wiring line is changed such that a voltage on the one electrode of the second capacitance becomes higher than a voltage on the one electrode of the first capacitance during the holding period, the holding period being the time in which the voltage of the pixel electrode is held. This makes it possible to reduce difference in potential when the voltage on the one electrode of the first capacitance becomes lower than a voltage on the one electrode of the second capacitance due to leakage current or the like during the holding period, the holding period being a time in which the corresponding switching elements are OFF and a voltage of the pixel electrode is held.

In the semiconductor device provided in the active matrix substrate, a configuration is possible in which when the pixel signal is being supplied to the pixel electrode from the signal line, the corresponding switching elements turn ON, and in which a voltage on the one electrode of the second capacitance is lower than a voltage on the one electrode of the first capacitance immediately before the voltage of the second capacitance wiring line is changed during the holding period, the holding period being the time in which the corresponding switching elements are OFF and the voltage of the pixel electrode is held. This makes it possible to reduce the difference in potential by changes in voltage of the second capacitance wiring line when a voltage on the one electrode of the first capacitance becomes lower than a voltage on the one electrode of the second capacitance during the holding period due to leakage current or the like, the holding period being the time in which the voltage of the pixel electrode is held.

In the semiconductor device provided in the active matrix substrate, a configuration is possible in which when the pixel signal is being supplied to the pixel electrode from the signal line, the corresponding switching elements turn ON, and in which the voltage of the second capacitance wiring line is changed two or more times at set intervals during which each switching element is OFF, the holding period being the time in which the corresponding switching elements are OFF and the voltage of the pixel electrode is held. In this way, by changing the voltage at set intervals in the holding period in which the voltage of the pixel electrode is held, it is possible to make the change in amount of voltage equal each time, and to simplify adjusting of the voltage of the second capacitance wiring line, for example.

In the semiconductor device provided in the active matrix substrate, a configuration is possible in which when the pixel signal is being supplied to the pixel electrode from the signal line, the corresponding switching elements turn ON, and in which the voltage of the second capacitance wiring line is changed in the same amount two or more times during the holding period, the holding period being the time in which the corresponding switching elements are OFF and the voltage of the pixel electrode is held. This makes it possible to simply adjusting of the voltage of the second capacitance wiring line in the holding period in which the voltage of the pixel electrode is held.

In the semiconductor device provided on the active matrix substrate, a configuration is possible in which when the pixel signal is being supplied to the pixel electrode from the signal wire, the corresponding switching elements turn ON, and in which voltages of all second capacitance wiring lines formed on the active matrix substrate are changed at the same time during the holding period, the holding period being the time in which the corresponding switching elements are OFF and the voltage of the pixel electrode is held. This makes it possible to simply the pixel driving process of the active matrix substrate.

In the semiconductor device provided on the active matrix substrate, a configuration is possible in which when the pixel signal is being supplied to the pixel electrode from the signal wire, the corresponding switching elements turn ON, and in which voltages of all second capacitance wiring lines formed on the active matrix substrate are changed to be the same voltage during the holding period, the holding period being the time in which the corresponding switching elements are OFF and the voltage of the pixel electrode is held. As such, the pixel driving process of the active matrix substrate can be simplified by controlling the voltage of all second capacitance wiring lines such that the voltages are equal during the holding period in which the voltage of the pixel electrode is held.

The semiconductor device can have an aspect in which the semiconductor device is provided in each of pixels placed in a matrix in the active matrix substrate, and in which the second capacitance wiring line in the semiconductor device is provided in one row of pixels in the matrix, the second capacitance wiring line also acting as a scanning line that supplies a control signal to each switching element of the semiconductor device provided in an adjacent row of pixels. By doing this, it is possible to reduce the number of wiring lines placed in the active matrix substrate and to increase the aperture ratio of the pixels.

In the semiconductor device, a configuration is possible in which the second capacitance wiring line or first capacitance wiring line is formed extending to a position that blocks light from being incident on at least one of the plurality of switching elements, the second capacitance wiring line or first capacitance wiring line also acting as a light-shielding film. This makes it possible to form the first or second capacitance wiring line and the light-shielding film as one component and to improve the aperture ratio.

An active matrix substrate using the semiconductor device is one embodiment of the present invention. A display device provided with a display part including the active matrix substrate, and a display device with a display part that is a liquid crystal panel or an organic EL panel are also included in the present invention.

The display device may be provided with a sensor that detects a state of a surrounding environment of the display part; and a display control part that controls driving of the display part, and a signal adjusting part that adjusts a frame frequency on the basis of a detection result from the sensor may be provided in the display control part.

This allows for the frame frequency of the display image displayed in the display part to be suitably adjusted in accordance with the surrounding environment, and thus making it easy to have a display device with excellent display performance.

The display device may be provided with a sensor that detects a state of a surrounding environment of the display part; and a display control part that controls driving of the display part, and a signal adjusting part that adjusts a signal of a second capacitance wiring line on the basis of a detection result from the sensor may be provided in the display control part.

This makes it possible to suitably adjust the signal of the second capacitance wiring line and to have suitable suppression of leakage current that is in accordance with the surrounding environment. As a result, it is possible to provide a display device with excellent display performance with ease.

Below, embodiments of a semiconductor device, an active matrix substrate, and a display device of the present invention will be described with reference to figures. In the descriptions below, the present invention will be illustratively explained when applied to a pixel electrode switching circuit used in an active matrix substrate of a liquid crystal panel. The dimensions of constituting members in respective figures do not truthfully represent the dimensions of actual constituting members, dimensional ratios of the respective constituting members, and the like.

Embodiment 1

Configuration Example of Liquid Crystal Display Device

FIG. 1 is a view showing a liquid crystal display device according to Embodiment 1 of the present invention. In FIG. 1, a liquid crystal display device 1 of the present embodiment is provided with a liquid crystal panel 2 arranged such that the top in FIG. 1 is the viewing side (the display side), and a backlight device 3 (a backlight unit) that is placed on the non-display side (the bottom in FIG. 1) of the liquid crystal panel 2 and that generates illumination light to illuminate the liquid crystal panel 2. The liquid crystal panel 2 forms a display part that displays information.

The liquid crystal panel 2 is provided with a color filter substrate 4 (an opposite substrate) and an active matrix substrate 5 (a TFT substrate), constituting a pair of substrates. The active matrix substrate 5 and the color filter substrate 4 are arranged to face each other, the periphery of both substrates is bonded with a sealing material, and a liquid crystal layer is provided in the area enclosed by the periphery of both substrates. In other words, the liquid crystal layer (not shown) is held between the color filter substrate 4 and the active matrix substrate 5.

One polarizing plate 6 or 7 each is provided on the outer surface of the color filter substrate 4 and the active matrix substrate 5. A plate-like transparent glass material or a transparent synthetic resin such as an acrylic resin is used for the color filter substrate 4 or the active matrix substrate 5. A resin film such as TAC (triacetyl cellulose) or PVA (polyvinyl alcohol) is used for the polarizing plates 6 and 7, and the respective plates are bonded to the color filter substrate 4 and the active matrix substrate 5 so as to at least cover the active display region of the display side on the liquid crystal panel 2.

The active matrix substrate 5 forms one of the pair of substrates described above, and the pixel electrode, thin-film transistor (TFT), and the like are formed between the liquid crystal layer and the active matrix substrate 5 for each of the plurality of pixels included in the display side of the liquid crystal panel 2 (explained in detail later). The switching circuit (the semiconductor device) of the present invention, which includes the thin-film transistor described above, is provided in each pixel unit in this active matrix substrate 5, as explained later. The color filter substrate 4 is the other substrate of the pair of substrates, and color filters, an opposite electrode, and the like are formed between the liquid crystal layer and the color filter substrate 4 on the color filter substrate 4 (not shown).

In the liquid crystal panel 2, an FPC (flexible printed circuit) 8 is provided that is connected to a control device (not shown), and this control device controls driving of the liquid crystal panel 2. The liquid crystal layer is operated on an individual pixel basis, and driving the display screen based on each pixel enables display of desired images on the display screen.

The liquid crystal mode and pixel structure of the liquid crystal panel 2 can be appropriately selected. The driving mode of the liquid crystal panel 2 can also be appropriately selected. In other words, any liquid crystal panel that is capable of displaying information can be used as the liquid crystal panel 2. Thus, a detailed structure of the liquid crystal panel 2 in FIG. 1 is not shown, and a description thereof will be omitted.

The backlight device 3 has a light-emitting diode 9 as a light source, and a light guide plate 10 arranged to face this light-emitting diode 9. A bezel 14 that has an "L"-shaped cross-section holds the light-emitting diode 9 and the light guide plate 10 with the liquid crystal panel 2 placed above the light guide plate 10 in the backlight device 3. A case 11 is placed on the color filter substrate 4. This way, the backlight device 3 is attached to the liquid crystal panel 2, and these components are integrated as a transmissive liquid crystal display device 1 in which illumination light from the backlight device 3 is incident on the liquid crystal panel 2.

A transparent synthetic resin such as an acrylic resin is used for the light guide plate 10, for example, and light from the light-emitting diode 9 enters the light guide plate 10. A reflective sheet 12 is arranged on the side opposite to (opposing) the liquid crystal panel 2 of the light guide plate 10. Optical sheets 13 such as a lens sheet and a diffusion sheet are provided on the liquid crystal panel 2 side (the light-emitting side) of the light guide plate 10. These optical sheets 13 change the light emitted from the light-emitting diode 9 and guided in a prescribed light-guide direction (from left to right in FIG. 1) inside the light guide plate 10 to the illumination light described above, which is planar and has even brightness. This light is then sent to the liquid crystal panel 2.

In the abovementioned descriptions, a configuration was described in which the edge-lit backlight device 3 having the light guide plate 10 is used, but the present embodiment is not limited to this, and a direct-lit backlight device may also be used. A backlight device can be used that has a light source other than a light-emitting diode, such as a cold cathode fluorescent tube or a hot cathode fluorescent tube.

(Configuration Example of Liquid Crystal Panel)

Figure 2:
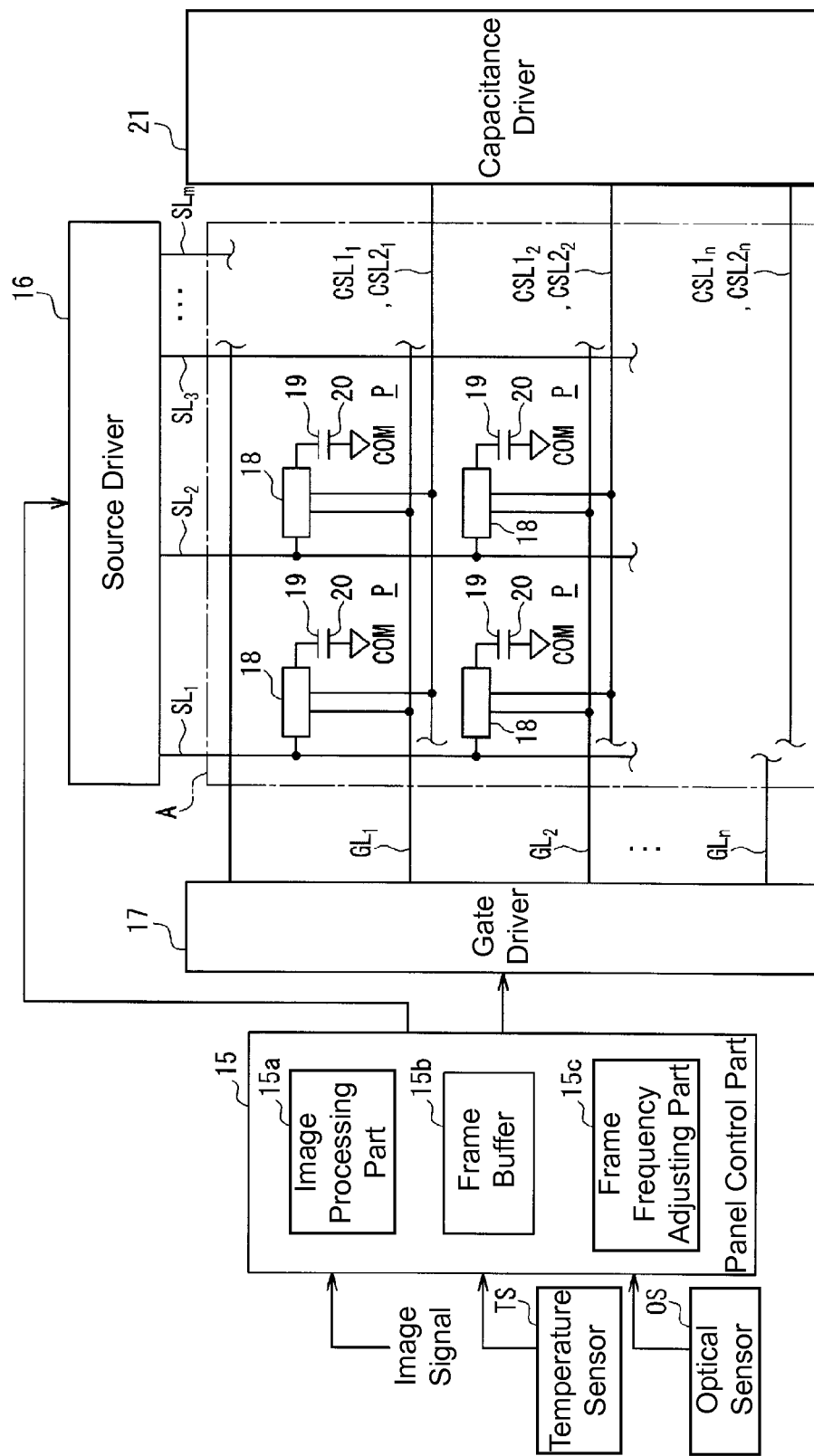
FIG. 2 is a view showing a configuration of the liquid crystal panel shown in FIG. 1.

FIG. 2 is a view describing a configuration of the liquid crystal panel shown in FIG. 1. In FIG. 2 the liquid crystal display device 1 (FIG. 1) is provided with: a panel control part 15 that is an example of a display control part, which controls driving of the liquid crystal panel 2 (FIG. 1), the liquid crystal panel 2 being the display part described above that displays information such as characters and images; and a source driver 16 and gate driver 17 that operate on the basis of instruction signals from this panel control part 15. A capacitance driver 21 that outputs prescribed signals to the plurality of capacitances described later is also provided in the liquid crystal display device 1. This capacitance driver 21 operates on the basis of instruction signals from the panel control part 15, in a similar manner to the source driver 16 and gate driver 17.

The panel control part 15 is provided inside the control device, and image signals from outside the liquid crystal display device 1 are inputted to the panel control part 15. Detection results from a temperature sensor TS that detects the surrounding temperature of the liquid crystal panel 2, and detection results from an optical sensor OS that detects the size of outside light entering the liquid crystal panel 2 are also inputted to the panel control part 15. The temperature sensor TS and optical sensor OS are examples of sensors that detect the surrounding environment of the liquid crystal panel (the display part) 2.

The panel control part 15 is also provided with: an image processing part 15a that performs prescribed image processing for image signals that have been inputted and that generates each instruction signal sent to the source driver 16 and gate driver 17; a frame buffer 15b that can store display data for each individual frame included in the inputted image signals; and a signal adjusting part 15c that adjusts the frame frequency of display images that are displayed on the liquid crystal panel 2. The panel control part 15 controls driving of the source driver 16 and gate driver 17 in accordance with the inputted image signals in order to display the information corresponding to the image signals on the liquid crystal panel 2.

The signal adjusting part 15c adjusts the frame frequency on the basis of each detection result from the temperature sensor TS and the optical sensor OS (described in detail later). The signal adjusting part 15c may adjust the voltage of the capacitance controlled by the capacitance driver instead of or in addition to the frame frequency on the basis of each detection result from the temperature sensor TS and the optical sensor OS, and the frame frequency or voltage of the capacitance may also be adjusted on the basis of each detection result of the temperature sensor TS and the optical sensor OS and the inputted image signals.

The source driver 16, gate driver 17, and capacitance driver 21 are placed on the active matrix substrate 5. Specifically, the source driver 16 is placed on the surface of the active matrix substrate 5 along the horizontal direction of the liquid crystal panel 2, in an area outside an active display region A of the liquid crystal panel 2, which is an example of a display panel. The gate driver 17 is placed on the surface of the active matrix substrate 5 along the vertical direction of the liquid crystal panel 2, in an area outside the active display region A. The capacitance driver 21 is placed on the surface of the active matrix substrate 5 along the vertical direction of the liquid crystal panel 2, in an area outside the active display region A, such that the capacitance driver 21 opposes the gate driver 17. The configuration of the source driver 16, gate driver 17, and capacitance driver 21 is not limited to the above. At least two of these drivers may be concentrated on one side of the active display region A, for example.

The source driver 16 and gate driver 17 are driving circuits that drive a plurality of pixels P provided on the liquid crystal panel 2 side on an individual pixel basis. A plurality of source electrode wiring lines SL1 to SLm (where "m" is an integer greater than or equal to 2; hereinafter collectively called "SL") and a plurality of gate electrode wiring lines GL1 to GLn (where "n" is an integer greater than or equal to 2; hereinafter collectively called "GL") are connected to the respective source driver 16 and gate driver 17. These source electrode wiring lines SL and gate electrode wiring lines GL constitute data wiring lines (signal lines) and scanning wiring lines (scanning lines), respectively, and are arrayed in a matrix so as to intersect each other on a base substrate (not shown) made of the transparent glass material or the transparent synthetic resin included in the active matrix substrate 5. In other words, the source electrode wiring lines SL are arranged on the base substrate so as to be parallel to the column direction (the vertical direction of the liquid crystal panel 2) of the matrix, and the gate electrode wiring lines GL are arranged on the base substrate so as to be parallel to the row direction (the horizontal direction of the liquid crystal panel 2) of the matrix.

First capacitance wiring lines CSL11 to CSL1n (where "n" is an integer greater than or equal to 2; hereinafter collectively called "CSL1"), and second capacitance wiring lines CSL21 to CSL 2n (hereinafter collectively called "CSL2") are provided in the active matrix substrate 5. The first capacitance wiring lines CSL11 to CSL1n and the second capacitance wiring lines CSL21 to CSL2n are each provided in parallel. To simplify the drawing, CSL1 and CSL2 are drawn as one line in FIG. 2. These first capacitance wiring lines CSL1 and second capacitance wiring lines CSL2 are connected to the capacitance driver 21. The first capacitance wiring lines CSL1 are connected to the pixel electrodes of respective pixels via the first capacitances. The second capacitance wiring lines CSL2 are connected to respective connecting points between a plurality of thin-film transistors via the second capacitances, the thin-film transistors being connected in series in the switching circuit 18 of each pixel (described in detail later).

The pixel P, which has the pixel electrode (in other words, the pixel driving circuit) switching circuit 18 using the semiconductor device of the present embodiment and a pixel electrode 19 connected to the switching circuit 18, is provided in the vicinity of each intersection of the source electrode wiring lines SL and gate electrode wiring lines GL. A common electrode 20 opposes the pixel electrode 19 in each pixel P while having the liquid crystal layer provided on the liquid crystal panel 2 therebetween. In other words, the switching circuit 18, pixel electrode 19, and common electrode 20 are provided in each pixel in the active matrix substrate 5.

The switching circuit 18 is configured such that a plurality of thin-film transistors are connected in series by connecting the respective source and drains thereof, and the switching circuit 18 connects the source electrode wiring lines SL and the pixel electrode 19. Each gate of the plurality of thin-film transistors is connected to the respective gate electrode wiring lines GL. The connecting point (node) between the plurality of thin-film transistors and the pixel electrode is connected to the first capacitance wiring lines CSL1 via the first capacitance. Among the plurality of thin-film transistors, the connecting point between adjacent thin-film transistors is connected to the second capacitance wiring lines CSL2 via the second capacitance. A light-shielding film that blocks light from the backlight is provided on at least one of the plurality of thin-film transistors of the switching circuit 18. The light-shielding film suppresses a large increase in leakage current of the thin-film transistors.

In the switching circuit 18, if a voltage that is sufficient enough to make each region between the source and drain conductive is applied to the respective gates of the plurality of thin-film transistors via the gate electrode wiring line GL, then the source electrode wiring line SL, the pixel electrode, and the first capacitance will be electrically connected. In this way, when the plurality of thin-film transistors turn ON, the pixel electrodes and the first capacitances are charged by a prescribed voltage that is applied from the source electrode wiring lines SL. Afterwards, when the gate voltage applied by the gate electrode wiring lines GL changes and the source/ drain of each of the plurality of thin-film transistors is non-conductive (OFF), the source electrode wiring lines SL, the pixel electrodes, and the first capacitances are electrically isolated, but voltage that has been charged to the pixel electrodes and the first capacitances is held. At this time, if the capacitance value of the second capacitance is smaller than the capacitance value of the first capacitance, then the drain potential and source potential of the thin-film transistor between the connecting point of the first capacitance and the connecting point of the second capacitance will not be the same potential, resulting in a difference in potential. Therefore, a voltage is applied via the second capacitance wiring lines CSL2 in the voltage holding period of the pixel electrodes such that the difference in potential approaches 0. This suppresses change in voltage of the pixel electrodes caused by leakage current.

To achieve the driving described above, the gate driver 17 can sequentially output a scanning signal (gate signal) to the gate electrode wiring lines GL1 to GLn on the basis of instruction signals from the image processing part 15*a* in order to turn ON each thin-film transistor of the corresponding switching circuits 18. The source driver 16 can output data signals (voltage signals (gradation voltage)) in accordance with the brightness (gradation) of the display images to the corresponding source electrode wiring lines SL1 to SLm on the basis of instruction signals received from the image processing part 15*a*.

The capacitance driver 21 can supply signals to the capacitance wiring lines CSL11 to CSL1*n* and CSL21 to CSL2*n* on the basis of the instruction signals from the image processing part 15*a* in order to control the voltage of the first capacitances and second capacitances in the voltage holding period of the pixel electrodes.

Each of the plurality of pixel P areas is formed in each area demarcated into a matrix by the source electrode wiring lines SL and the gate electrode wiring lines GL in the active matrix substrate 5. Red (R), green (G), and blue (B) pixels are included in these plurality of pixels P. These RGB pixels are sequentially arranged in this order in parallel with each gate electrode wiring line GL1 to GLn, for example. These RGB pixels are able to perform display of the corresponding colors due to color filter layers (not shown) provided on the color filter substrate 4 side.

The green pixels can display green by green color filters provided in respective areas of the opposite substrate corresponding to the green pixels. Similarly, the red pixels and the blue pixels can display red and blue, respectively, by red and blue color filters respectively provided in the regions of the opposite substrate corresponding to the respective pixels. The green pixel, the red pixel, and the blue pixel constitute one pixel unit, which allows a desired color to be displayed.

As described above, the liquid crystal display device 1 is provided with a display area in which a plurality of pixels are placed in a matrix, and a driver for driving the display pixels. This driver may be simultaneously formed on the active matrix substrate, or may be connected by being mounted on a terminal area as a driver chip.

In the liquid crystal display device 1 with the configuration described above, the orientation direction of the liquid crystal material in the liquid crystal layer is controlled for each pixel depending on whether each thin-film transistor is ON or OFF. This controls the transmittance of light from the backlight for each pixel. The transmittance of light from the backlight is controlled for each red pixel, green pixel, and blue pixel, for example. Performing display in the pixel unit with the desired intensity and display color allows for the display of desired images in the liquid crystal display panel.

(Configuration Example and Operation Example of Switching Circuit)

Figure 3:
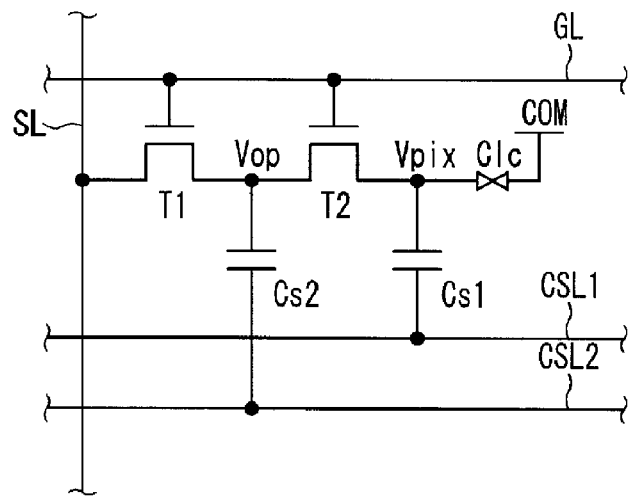
FIG. 3 is a circuit diagram showing an example of an equivalent circuit of the switching circuit shown in FIG. 2.

FIG. 3 is a circuit diagram showing an example of an equivalent circuit of the semiconductor device used in the switching circuit 18 shown in FIG. 2. In the example shown in FIG. 3, the switching circuit 18 has a first thin-film transistor T1 and a second thin-film transistor T2, which are connected in series. An MIS (Metal-Insulator-Semiconductor) transistor can be used for each thin-film transistor T1 and T2, for example. One end of these thin-film transistors T1 and T2 is connected to the pixel electrode, which is one electrode of a liquid crystal capacitance Clc. The liquid crystal capacitance Clc is formed between this pixel electrode and a common electrode COM opposing the pixel electrode. The other end of the thin-film transistors T1 and T2 is connected to the source electrode wiring line SL.

The switching circuit 18 has a first capacitance Cs1 in which one electrode is connected to one end of the switching circuit 18 and the other electrode is connected to the first capacitance wiring line CSL1. The switching circuit 18 also has a second capacitance Cs2 in which one electrode is connected between the adjacent thin-film transistors T1 and T2, and the other electrode is connected to the second capacitance wiring line CSL2. In other words, the first capacitance Cs1 connected to the pixel electrode side of the thin-film transistors T1 and T2, and the second capacitance Cs2 connected between the thin-film transistors T1 and T2, are each connected to different capacitance wiring lines CSL1 and CSL2. This enables control of a voltage (Vop) between the two thin-film transistors T1 and T2 by signals from the second capacitance wiring line CSL2. If the Vop is controlled in the voltage holding period of the pixel electrode in order to make the voltage value of Vop correspond to Vpix, then the Vds (the difference in potential between the drain and the source) of the thin-film transistor T2 can be made smaller, and leakage current can be reduced, for example. As such, in the present embodiment, the first capacitance wiring line CSL1 and the second capacitance wiring line CSL2 are two wiring lines with independent voltage control. The first capacitance wiring line can simply be called "the first wiring line," and the second capacitance wiring line can be called "the second wiring line," in contrast to the first wiring line.

Figure 4:
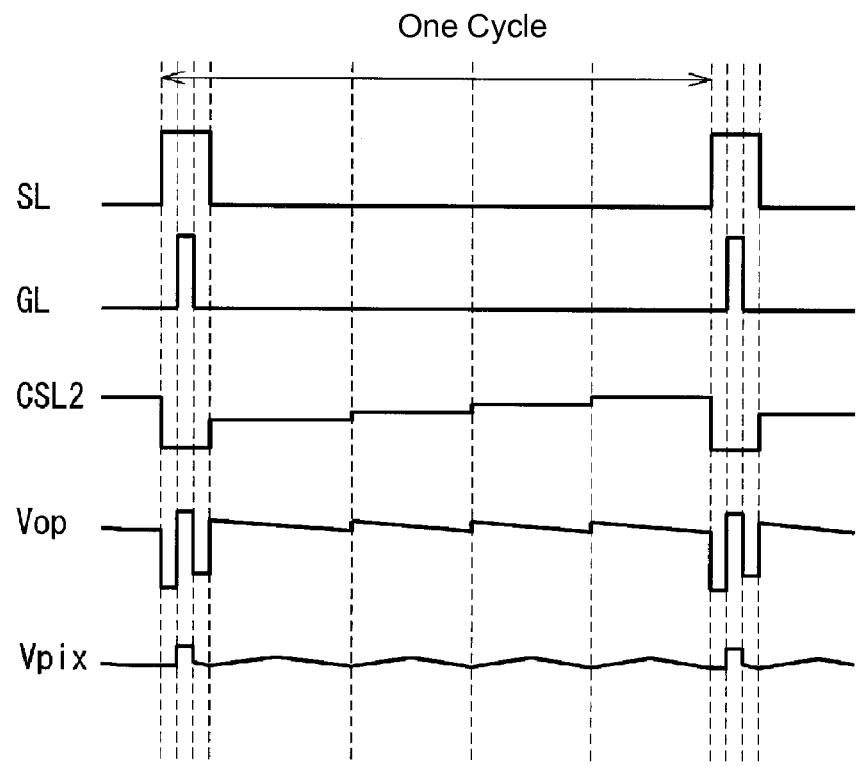
FIG. 4 is a view showing an example of driving signal waveforms of the switching circuit shown in FIG. 3.

Specifically, as shown in FIG. 4, the voltage value given to CSL2 in the voltage holding period of the pixel electrode during the frame cycle changes at least one time. In the example shown in FIG. 4, the value of the voltage applied to the capacitance wiring line CSL2 is uniformly increased three times in the holding period of one cycle. In other words, in the holding period in which the source/drain of the thin-film transistor T2 between the two capacitances Cs1 and Cs2 is OFF, the voltage of the capacitance wiring line CSL2 is changed such that the voltage Vop of the capacitance Cs2 side will be greater than the voltage Vpix of the capacitance Cs1 side. The voltage is changed at a time such that the voltage Vop on the capacitance Cs2 side becomes lower than the voltage Vpix on the capacitance Cs1 side before the change in voltage of the capacitance wiring line CSL2, and becomes higher after the change in voltage.

In the example shown in FIG. 4, the change in voltage of the capacitance wiring line CSL2 during the holding period occurs a plurality of times over a uniform interval, and the amount of voltage changed each time is the same. This allows the voltage of the capacitance wiring line CSL2 to be controlled with time interval and amount of voltage changed as parameters, for example, and makes adjustment easy to perform.

It is preferable that the direction of the change (increase or decrease) in applied voltage to the capacitance wiring line CSL2 during the holding period be such that the difference in potential between Vop and Vpix becomes smaller. In other words, it is preferable to change the voltage towards a direction where the difference in potential approaches 0. As described above, during one or more gradation voltages, the voltage applied to CSL2 during the holding period can be controlled such that Vop>Vpix immediately after the change in voltage, for example. In conventional technology, the charge held in the pixel electrode is lost during the holding period, but by controlling the voltage as in the present embodiment, a charge can be supplied to pixel parts at a prescribed time during the holding period.

The amount and timing of the change in voltage of the capacitance wiring line CSL2 during the holding period can be suitably configured in accordance with the characteristics of the switching circuit 18.

The amount ΔCSL2 of change in voltage of the capacitance wiring line CSL2 during the holding period can be calculated using general formula (1) below, as an example.

$$\Delta CSL2 \geq (Vpix - Vop) \times Cs2/Cop \quad (1)$$

In general formula (1) above, Cop is the summation of the capacitance that is linked to the node (the node on the line connecting the thin-film transistors T1 and T2) shown by Vop in FIG. 3. Cop can be the summation of Cs2, the capacitance between the gate/drain of the transistor T1, the capacitance between the gate/source of the transistor T2, and parasitic capacitance between each signal wiring line (SL, GL, CSL1) and the node, for example. Cs2 in general formula (1) expresses capacitance of the second capacitance Cs2 shown in FIG. 3.

The operations described above enable the voltage value of Vop, which changes over time, to be reset. Therefore, it is possible to prevent the voltage value of Vop deviating from the voltage value of Vpix over time and the Vds of the thin-film transistor T2 increasing, and it is also possible to prevent the off-leakage current from increasing. Accordingly, it is possible to hold the pixel voltage for a long period of time as compared with when this driving is not performed, and it is possible for driving to occur at a very low driving frequency. As a result, a reduction in power consumption in the display device can be achieved.

The light-shielding film is provided in the thin-film transistors T1 and T2 of the switching circuit 18. It is preferable for the light-shielding film to be in a position, below the thin-film transistors (the backlight device 3 side), for example, which blocks light such that illumination light from the backlight device 3 will not reach the thin-film transistors. The light-shielding film may also be placed on the top of the thin-film transistors (the display surface side).

The light-shielding film can prevent illumination light from the backlight device 3 and light (external light) from outside the liquid crystal panel 2 from directly reaching the channel regions of the thin-film transistors T1 and T2. This suppresses a large increase in off-leakage current.

Figure 5:
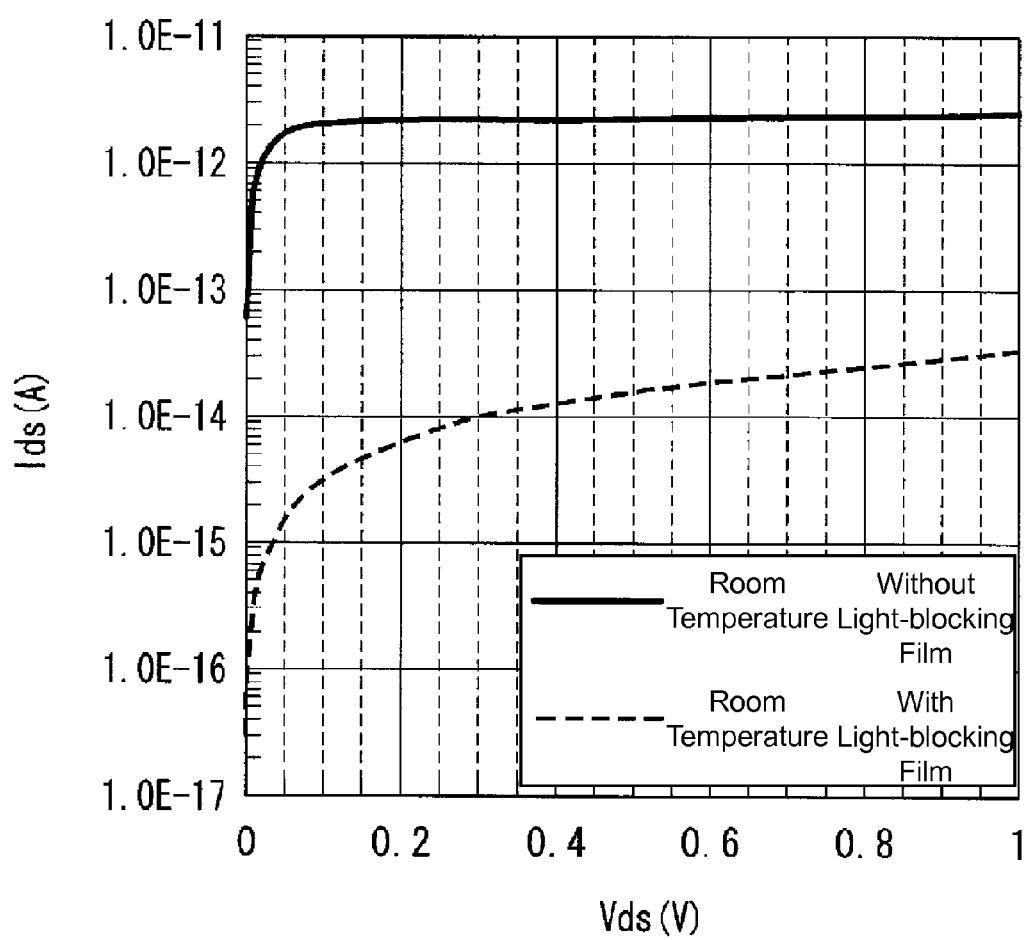
FIG. 5 is a graph showing changes in off-leakage current of thin-film transistors with and without a light-shielding film.

FIG. 5 is a graph showing changes in off-leakage current of a thin-film transistor with and without the light-shielding film. In the graph shown in FIG. 5, the vertical axis shows an off-leakage current value (Ids) of the thin-film transistor, and the horizontal axis shows the voltage between the source and drain (Vds) of the thin-film transistor. In the example shown in FIG. 5, providing the light-shielding film leads to a double-digit reduction in off-leakage current of the thin-film transistor.

(Operation Example of Display Panel)

Figure 6:
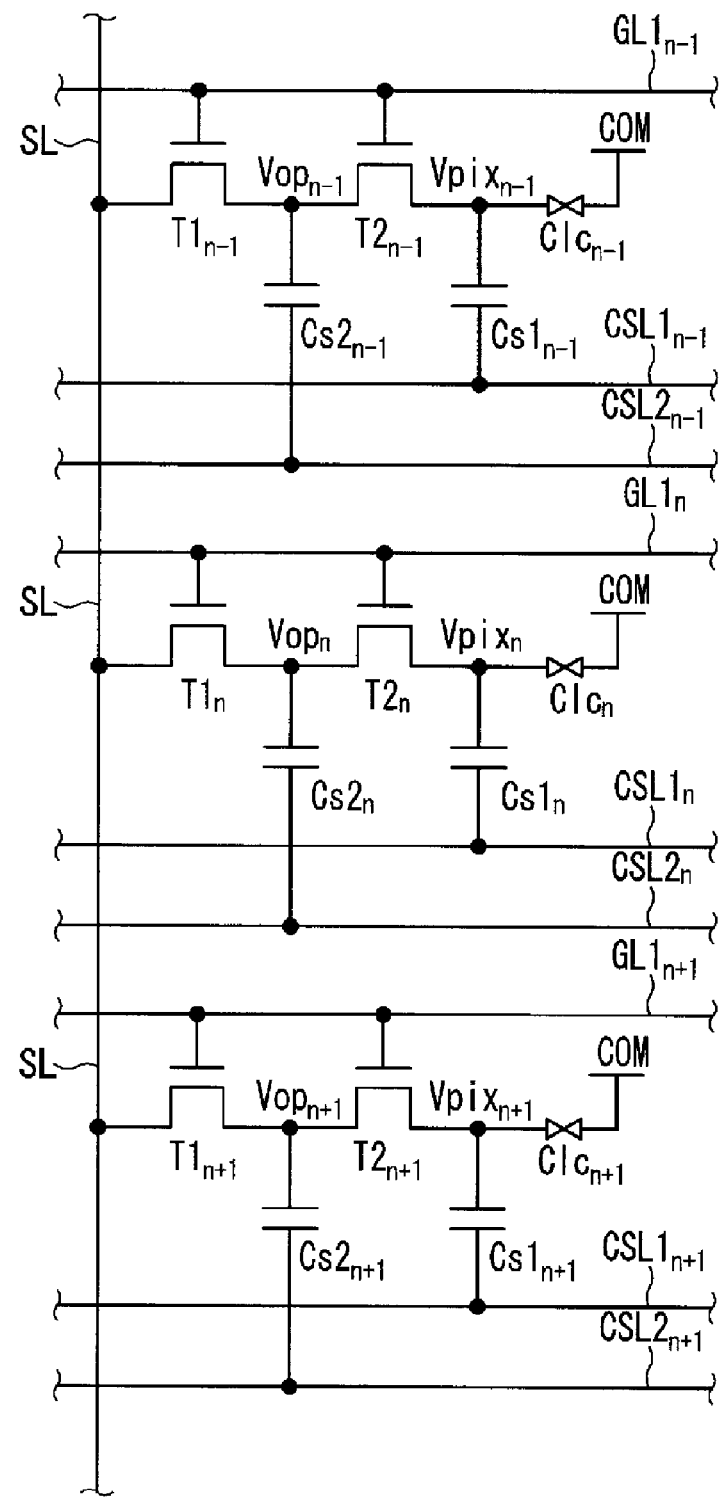
FIG. 6 is a circuit diagram showing an example of an equivalent circuit of switching circuits arranged in the vertical direction on an active matrix substrate 5.

FIG. 6 is a circuit diagram showing one example of equivalent circuits of switching circuits arranged in the vertical direction (the column direction of the matrix) in the liquid crystal panel 2, among the switching circuits 18 provided for respective pixels in the active matrix substrate 5. In the example shown in FIG. 6, three switching circuits with the configuration shown in FIG. 3 are arranged in the vertical direction, and these three switching circuits share the source electrode wiring line SL, which extends in the vertical direction.

Figure 7:
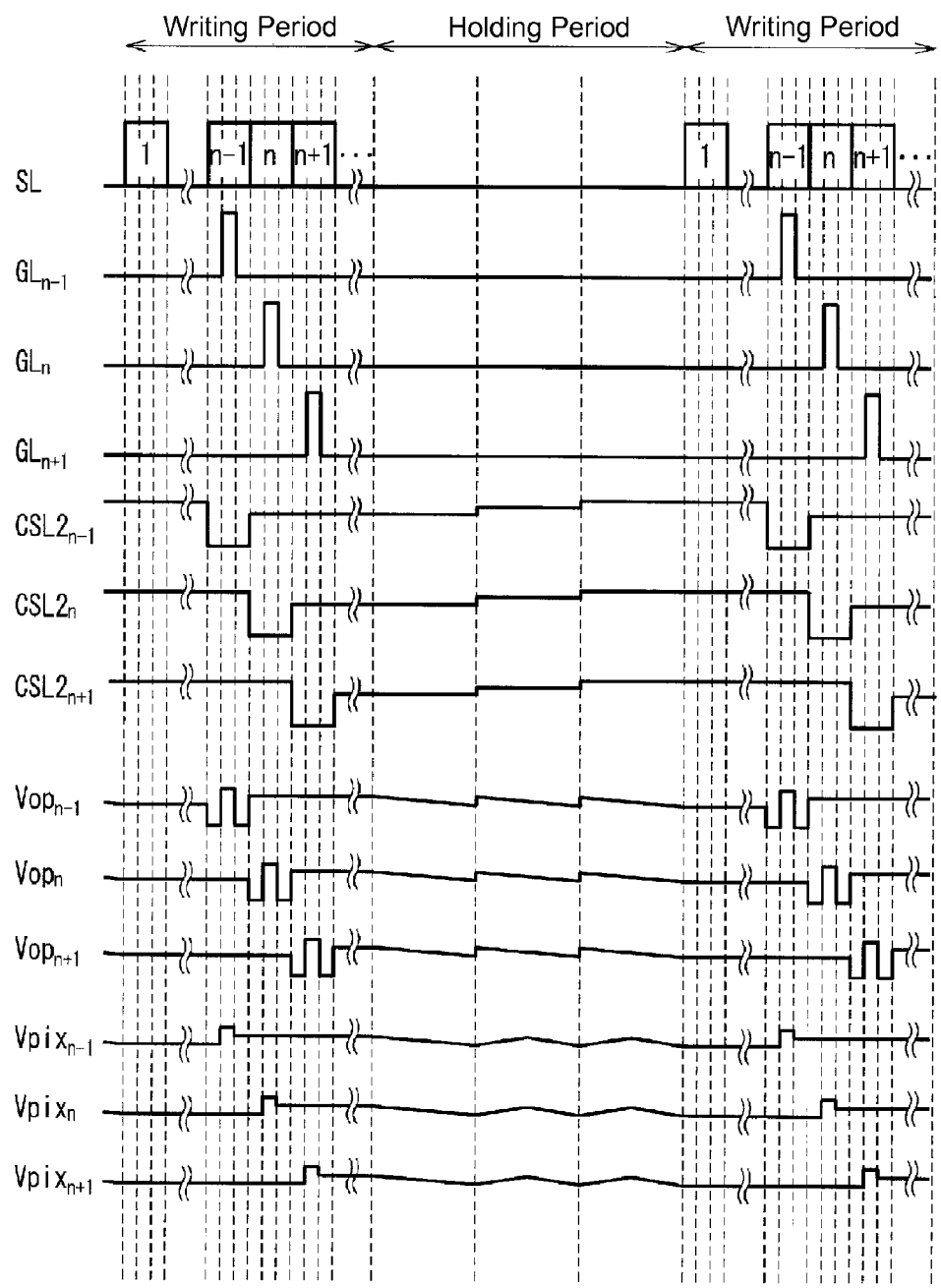
FIG. 7 is a view showing an example of signal waveforms when the circuits shown in FIG. 6 are driven.

FIG. 7 is a view showing one example of signal waveforms when the circuits shown in FIG. 6 are driven. In the example shown in FIG. 7, a voltage is applied to turn ON thin-film transistors T1n−1, T2n−1, T1n, T2n, T1n+1, and T2n+1 to each gate electrode wiring line GLn−1, GLn, GLn+1 in accordance with a voltage timing 1, . . . n−1, n, n+1 that expresses a pixel value to be applied via the source electrode wiring line SL during the writing period.

When the voltage of the pixel value of number "n" is applied to the source electrode wiring line SL, an ON voltage is applied to the gate wiring line GLn, and the thin-film transistors T1 and T2 turn ON, for example. In this way, in the n-row pixels, the source electrode wiring line SL and the pixel electrode are electrically connected to each other, and the prescribed voltage is charged in accordance with the pixel value to be displayed to a liquid crystal capacitance Clcn and a first capacitance Cs1n. In other words, a voltage Vpixn of the pixel electrode is a voltage that corresponds to the pixel value. At this time, a pulse voltage is also applied to a second capacitance wiring line CSL2n in the n row, and a voltage Vopn between the two thin-film transistors T1 and T2 becomes a prescribed voltage.

Next, when the voltage of the pixel value of number n+1 is applied to the source electrode wiring line SL, the voltage of the gate electrode wiring line GLn returns to normal from the ON voltage, and an ON voltage is applied to the gate wiring line GLn+1 in the n+1 row. The holding period of the pixel voltage starts in the pixels in the n row at this time. In the example shown in FIG. 7, the holding period starts after the writing period ends, but the start time of the holding period may be before or after, and is not restricted to either. In the voltage applying operations described above, the voltage application is repeated for all rows and columns in the matrix.

In the holding period, voltage is changed twice at the same time in capacitance wiring lines CSL21, . . . CSL2n−1, CSL2n, and CSL2n+1. This resets voltage Vopn−1, Vopn, and Vopn+1 between the two thin-film transistors T1n−1 and T2n−1, T1n and T2n, and T1n+1 and T2n+1. In other words, in the holding period, the voltage of the capacitance wiring line CSL2 is controlled such that Vop≥Vpix immediately after the resetting of Vopn−1, Vopn, and Vopn+1. This change in voltage during the holding period of the capacitance wiring line CSL2 suppresses change caused by leakage current of pixel electrode voltages Vpixn−1, Vpixn, Vpixn+1 for each pixel.

In the example shown in FIG. 7, the voltages of all capacitance wiring lines CSL21, . . . CSL2n−1, CSL2n, CSL2n+1, . . . , on the active matrix substrate are controlled so as to be equal during the holding period. The timing of change in voltages during the holding period is also controlled so as to be the same for all capacitance wiring lines CSL21, . . . CSL2n−1, CSL2n, CSL2n+1, . . . . This allows the processing in the capacitance driver 21 to be simplified.

(Modification Examples for Operation of Display Panel)

Figure 8:
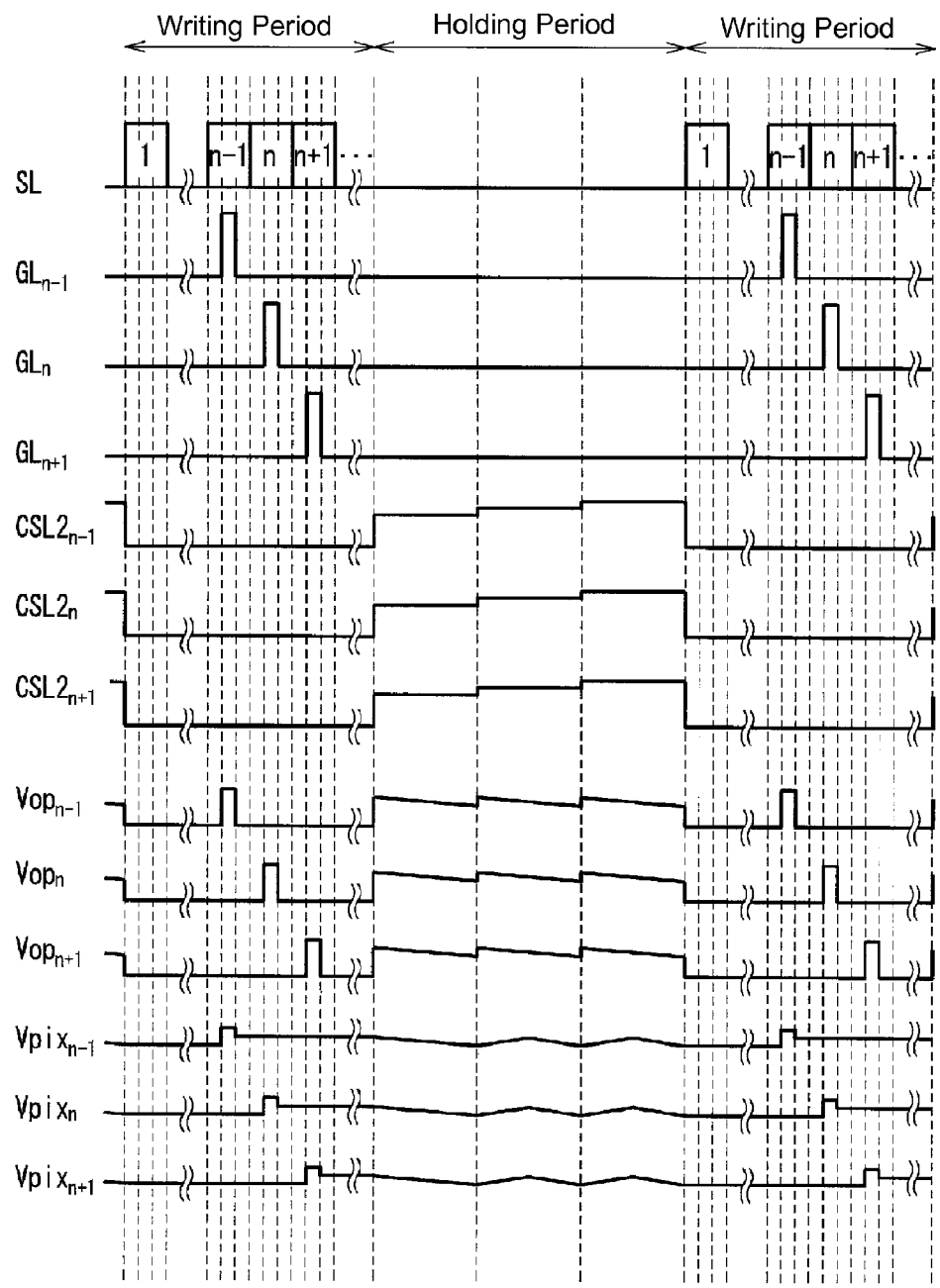
FIG. 8 is a view showing other examples of driving signal waveforms in the circuits in FIG. 6.

FIG. 8 is a view showing other examples of driving signal waveforms in the circuits in FIG. 6. In the example shown in FIG. 8, the voltage is changed in the writing period for all capacitance wiring lines CSL21, . . . CSL2n−1, CSL2n, CSL2n+1 at the same time. Specifically, the voltage of all capacitance wiring lines CSL21, . . . CSL2n−1, CSL2n, and CSLn+1 are set to a low level from the start of pixel writing on the first row until the end of pixel writing on the final row. When pixel writing of the final row ends, a prescribed level of voltage is applied. By making the timing when the voltage is applied to capacitance wiring line CSL2 the same among all of the plurality of capacitance wiring lines CSL21, . . . CSL2n−1, CSL2n, and CSL2n+1 in both the holding period and the writing period, the driving can be simplified.

Conversely, the timing of applied voltage during the holding period can also be changed individually for each capacitance wiring line CSL21, . . . CSL2n−1, CSL2n, CSL2n+1.

(Example Structure of Switching Circuit)

Figure 9:
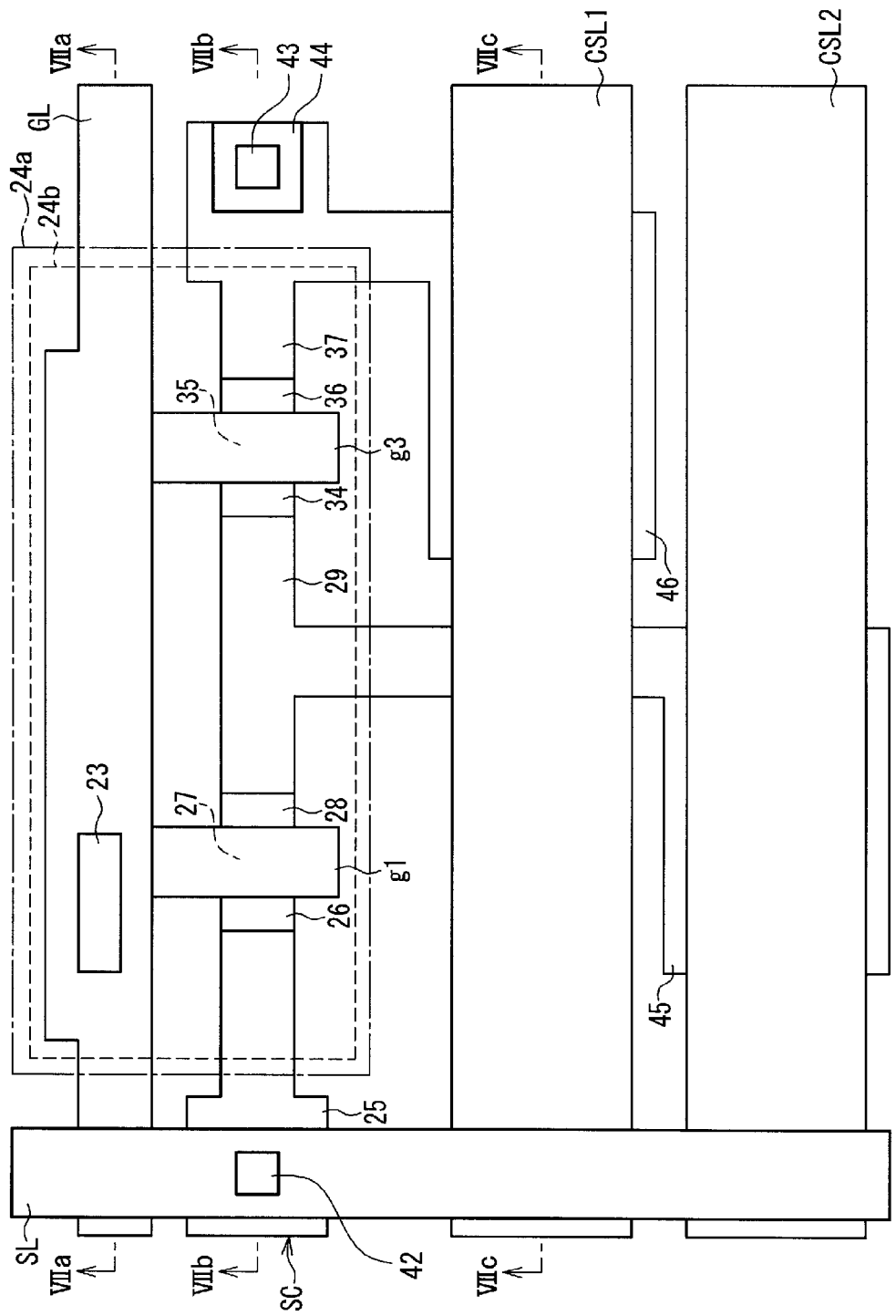
FIG. 9 is a plan view showing a structure of the main parts of a switching circuit.
Figure 10:
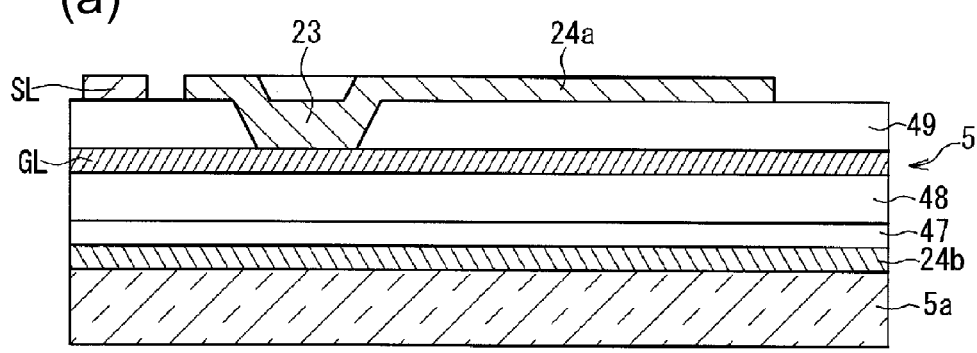
FIGS. 10(a), 10(b), and 10(c) are, respectively, a cross-sectional view along the line VIIa-VIIa, a cross-sectional view along the line VIIb-VIIb, and a cross-sectional view along the line VIIc-VIIc in FIG. 9.
Figure 10:
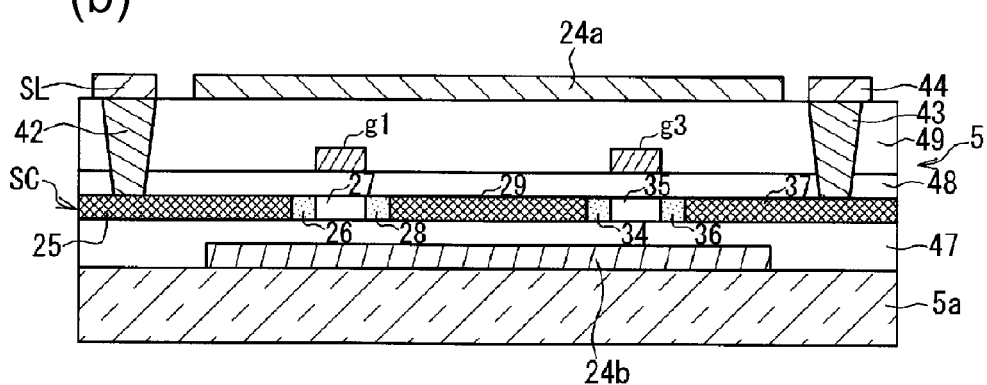
Figure 10:
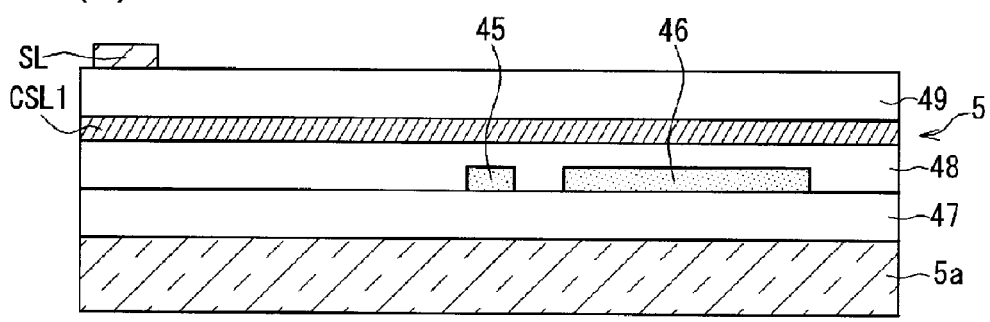

FIG. 9 is a plan view showing a structure of the main parts of the switching circuit. FIGS. 10(a), 10(b), and 10(c) are, respectively, a cross-sectional view along the line VIIa-VIIa, a cross-sectional view along the line VIIb-VIIb, and a cross-sectional view along the line VIIc-VIIc in FIG. 9.

As shown in FIG. 9, in the switching circuit 18 a silicon layer SC is provided as a substantially linear semiconductor layer below gate electrodes g1 and g3, which are connected to the gate electrode wiring line GL. In the switching circuit 18, as shown by the dotted line in FIG. 9, a light-shielding film 24b is formed below the silicon layer SC. The light-shielding film 24b mutually overlaps the gate electrode wiring line GL in a direction (the thickness direction of the active matrix substrate 5) perpendicular to the page of FIG. 9. In other words, the light-shielding film 24b is provided below the gate electrodes g1 and g3 of the thin-film transistors T1 and T2, and acts as a lower light-shielding film that blocks light from reaching these thin-film transistors T1 and T2.

It is preferable that the light-shielding film 24b be formed extending over an area sufficient enough to block illumination light from the backlight such that the light is not incident on channel regions 27 and 35 below the gate electrodes g1 and g3 of the thin-film transistors T1 and T2. Therefore, the light-shielding film 24b shown in FIG. 9 is formed not just below the channel regions 27 and 35, but also extending to the lower parts of the channel regions 27 and 35 and to the peripheries thereof.

In the switching circuit 18, as shown by the one-dot chain line in FIG. 9, an upper light-shielding film 24a is formed above the silicon layer SC. This upper light-shielding film 24a is provided so as to cover the thin-film transistors T1 and T2. The upper light-shielding film 24a is electrically connected to the gate electrode wiring line GL via a contact 23.

A lightly doped drain area (LDD area) 46 for forming the first capacitance Cs1, and a lightly doped drain area 45 for forming the second capacitance Cs2 are formed extending from the silicon layer SC, and these lightly doped drain areas 45 and 46 are formed below each capacitance wiring line CSL1 and CSL2 to form a prescribed capacitance in the active matrix substrate 5.

As shown FIGS. 10a to 10c, in the active matrix substrate 5, the switching circuit 18 is provided in each pixel on a main substrate body 5a formed of a glass substrate. Specifically, the light-shielding film 24b is formed on the main substrate body 5a in the area where the switching circuit 18 is formed. An underling insulating film 47 is formed so as to cover the light-shielding film 24b and the main substrate body 5a, and the silicon layer SC is provided on this underlying insulating film 47.

Provided in the silicon layer SC are high-concentration regions (shown by the crosshatch in FIG. 10) 25, 29, and 37 in which a high concentration of an n-type impurity such as phosphorous, for example, has been implanted, lightly doped drain regions (LDD regions, shown by the dots in FIG. 10) 26, 28, 34, and 36 in which a low concentration of an n-type impurity has been implanted, and the channel regions 27 and 35 formed directly below the gate electrodes g1 and g3, respectively. The LDD areas 26, 28, 34, and 36 are disposed at both ends of each of the channel regions 27 and 35 in the lengthwise direction of the silicon layer SC. A gate insulating film 48 is formed so as to cover the silicon layer SC, and the gate electrodes g1 and g3 are formed on this gate insulating film 48. This forms the thin-film transistors T1 and T2 as n-type transistors. An interlayer film 49 is formed on the gate insulating film 48 so as to cover the gate electrodes g1 and g3.

The source electrode formed in the source electrode wiring line SL and a drain electrode 44 are formed on the interlayer film 49 in the switching circuit 18. The source electrode is connected to the source region 25 provided in the silicon layer SC via a contact hole 42, and the drain electrode 44 is connected to the drain region 37 provided in the silicon layer SC via a contact hole 43.

The upper light-shielding film 24a is formed on the interlayer film 49 so as to be in the same layer as the source electrode and the drain electrode 44 in the switching circuit 18. As shown in FIG. 10(b), this upper light-shielding film 24a is provided above the gate electrodes g1 and g3 between the source electrode and the drain electrode 44, and blocks light from reaching the lightly doped drain regions 26, 28, 34, and 36 and the channel regions 27 and 35. In other words, the upper light-shielding film 24a can prevent light from the top of FIG. 10(b) being incident on the lightly doped drain regions 26, 28, 34, and 36 and the channel regions 27 and 35.

(Specific Examples of Manufacturing Method)

Specific examples of the manufacturing method for the switching circuit 18 will be described with reference to FIGS. 10(a) to 10(c).

First, a metal such as molybdenum or tungsten is deposited on the main substrate body 5a by sputtering, and then photo-lithography and etching are used to perform patterning to form the light-shielding film 24b. The specific film thickness of this light-shielding film 24b can be approximately 100 to 200 nm.

Next, a SiN film and $SiO_2$ film are formed in this order using CVD (chemical vapor deposition) at a film thickness of 100 nm each as the underlying insulating film 47, for example. Afterwards, an amorphous silicon film with a film thickness of 50 nm is formed above the underlying insulating film 47, and then is made into polysilicon by laser crystallization. This polysilicon is doped with boron for channel doping to adjust the threshold value.

Next, an $SiO_2$ film with a thickness of 80 nm is formed as the gate insulating film 48 above the polysilicon, a metal film such as molybdenum or tungsten is deposited above the gate insulating film 48, and patterning is performed to form the gate electrodes g1 and g3. In order to form the lightly doped drain regions 26, 28, 34, and 36, an n-type impurity, phosphorous, for example, is used for doping at low concentrations with these gate electrodes g1 and g3 as masks. Then, photoresist is formed in order to ensure the length dimension (LDD length) of each lightly doped drain region 26, 28, 34, and 36, and afterwards doping with phosphorous is performed in order to form the source region 25, drain region 37, and high-concentration region 29.

In the lightly doped drain regions 26, 28, 34, and 36, the doping amount is adjusted so that the sheet resistance value thereof will be around 50 kΩ to 150 kΩ ($1 \times 10^{13}$ to $10^{14}/cm^2$, for example). This doping amount is used to negate the p-type impurity (boron) used for the previous channel doping, thereby forming the n-type light doped drain regions 26, 28, 34, and 36. The source region 25, drain region 37, and high-concentration region 29 are doped with around $1 \times 10^{15}/cm^2$ of phosphorous so that the sheet resistance values thereof are less than or equal to 1 kΩ. Then, heat treatment at 500° C. to 600° C. is done for one hour in order to activate the impurities. In order to shorten the heat treatment time, a flash lamp annealing device may be used for heat treatment at 650° C. to 700° C. for a few minutes, for example.

Next, an $SiO_2$ film and an SiN film are formed as the interlayer film 49 at around 100 nm to 300 nm each, and the contact holes 42 and 43 are formed for connecting the source electrode and drain electrode 44, respectively. A metal film made of Al or an Al alloy, or a multilayer film of these for the source electrode, drain electrode 44, and wiring lines, for example, is deposited and patterned.

Finally, although not shown in the drawings, a planarizing film made of a resin film or the like is formed after the wiring lines, and in order to form the pixel electrode 19 for the liquid crystal display device 1, a transparent electrode (ITO, for example) that will act as the pixel electrode 19 is formed on the planarizing film. Al, Ag, or an alloy thereof is sometimes formed as a reflective electrode on the ITO.

In the descriptions above, a method for forming the thin-film transistors T1 and T2 as n-type transistors was described, but if forming the thin-film transistors T1 and T2 as p-type transistors, then a p-type impurity such as boron may be used as the impurity for forming the source region 25 and drain region 37, for example. Since the forming method allows for the driver circuit to be formed in the panel periphery, the switching circuit 18 of the present structure can also be applied to switching elements and the like in which low leakage current is required.

In the examples described above, the light-shielding films 24a and 24b are placed above and below the thin-film transistors T1 and T2, respectively, but the light-shielding films 24a and 24b do not necessarily need to be provided on both sides of the thin-film transistors T1 and T2. An increase in leakage current caused by illumination light from the backlight can be suppressed by the light-shielding film being placed at least below the thin-film transistor T2. In a liquid crystal display, the black matrix, which is formed in the color filter substrate, is placed above the thin-film transistor, for example. By making this black matrix function as an upper light-shielding film, the upper light-shielding film 24a shown in FIGS. 9 and 10 can be omitted (see modification examples below).

The above was a description of the switching circuit 18, but the active matrix substrate 5 also has a semiconductor film, gate insulating film, gate signal wire, source signal wire, overcoat film, planarizing film, pixel electrode, alignment film, and the like laminated on a main substrate body in a similar manner. The TFT structure may be a bottom gate type in which the gate signal wire is positioned on the bottom, or may be a top gate type in which the semiconductor film is formed first and then the gate signal wire is positioned on top of that. Change in potential of the pixel electrode caused by off-leakage current of the TFT or parasitic capacitance can be suppressed by forming a storage capacitance Cs between the capacitance wiring line and the drain electrode on the main substrate body.

(Modification Examples for Structure of Switching Circuit)

Figure 11:
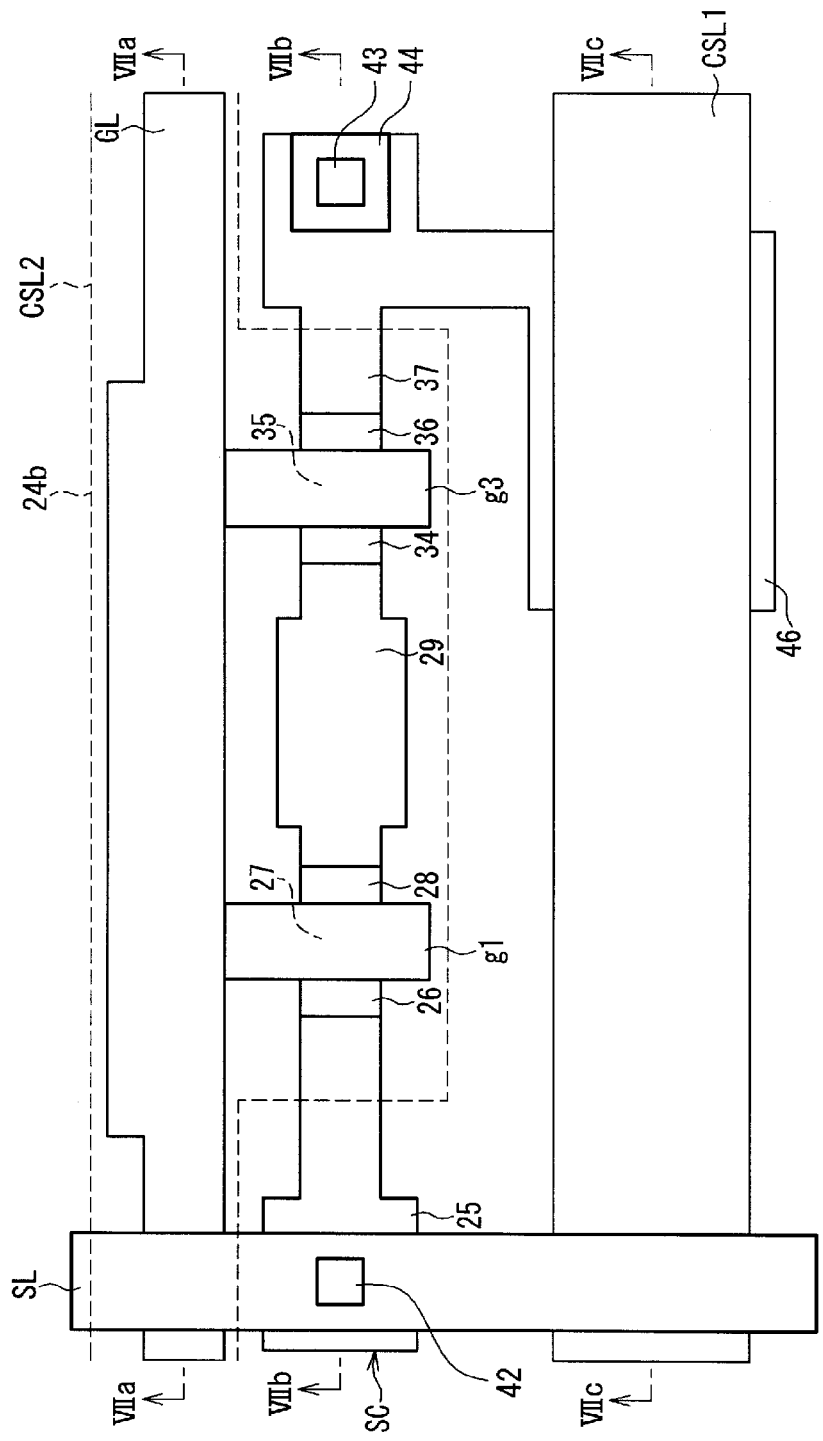
FIG. 11 is a plan view showing a modification example of the structure of the main parts of the switching circuit described above.

FIG. 11 is a plan view showing a modification example of the structure of the main parts of the switching circuit described above. FIGS. 12(a), 12(b), and 12(c) are, respectively, a cross-sectional view along the line VIIa-VIIa, a cross-sectional view along the line VIIb-VIIb, and a cross-sectional view along the line VIIc-VIIc in FIG. 11.

In the present example, the upper light-shielding film is omitted. The capacitance wiring line CSL2 is formed in the layer between the switching circuit and the backlight, and is formed as the light-shielding member 24b extending to below the thin-film transistors T1 and T2.

Figure 12:
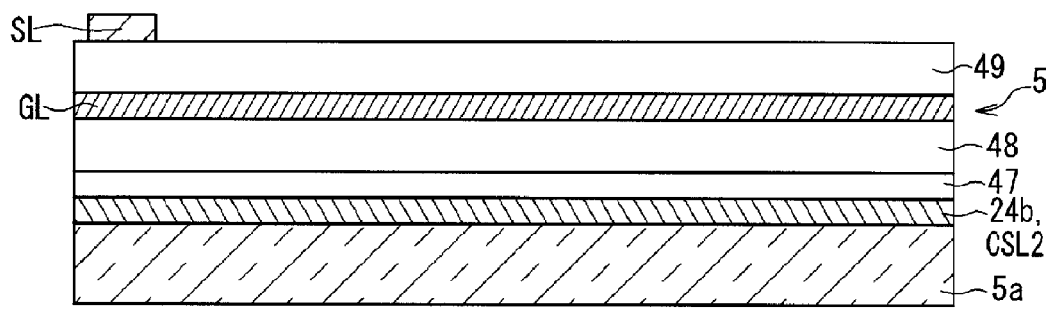
FIG. 12(a), 12(b), 12(c) are, respectively, a cross-sectional view along the line VIIa-VIIa, a cross-sectional view along the line VIIb-VIIb, and a cross-sectional view along the line VIIc-VIIc in FIG. 11.
Figure 12:
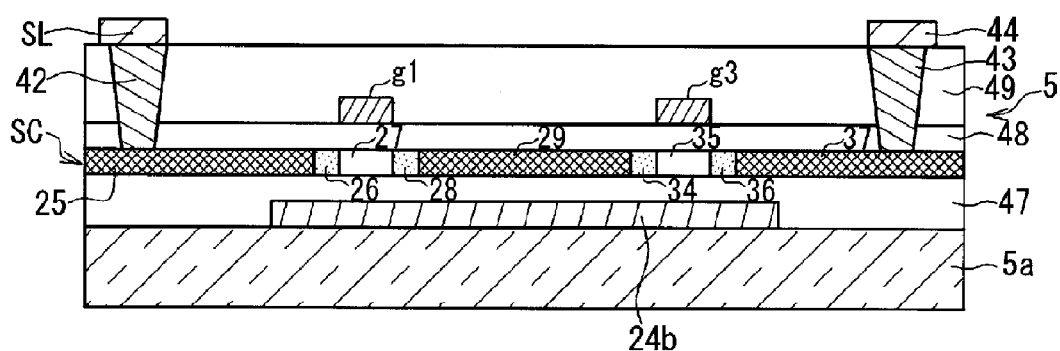
Figure 12:
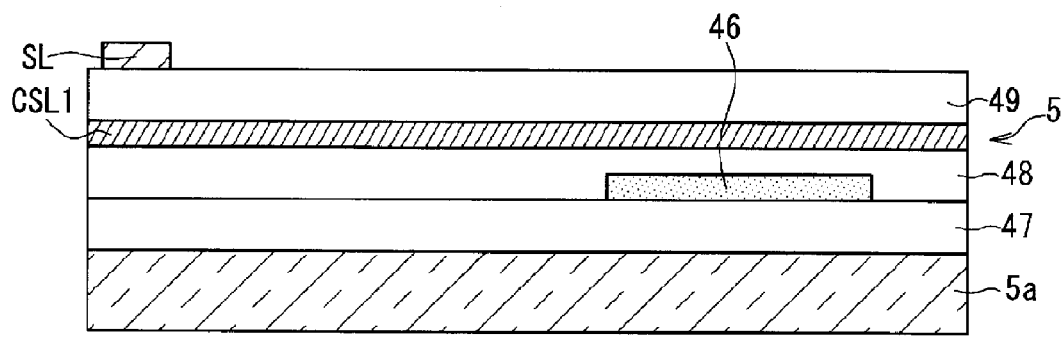

Specifically, as shown in FIGS. 11 and 12, the capacitance wiring line CSL2 is formed extending below the high-concentration region 29 of the silicon layer SC, which connects the thin-film transistors T1 and T2. In this way, the second capacitance Cs2 is formed by the high-concentration region 29, the capacitance wiring line CSL2, and the underlying insulating film 47 between these. In the example shown in FIG. 11, in order to ensure the second capacitance Cs2, the high-concentration region 29, which is the connecting part between the thin-film transistors T1 and T2, is wider than the other parts, but the high-concentration region 29 is not limited to any particular shape or width. In order to ensure the second capacitance Cs2, the area of the high-concentration region 29 can be configured to a suitable size in accordance with the permittivity, thickness, and the like of the underlying insulating film 47.

The capacitance wiring line CSL2 is formed to overlap at least the channel regions 27 and 35 of the thin-film transistors T1 and T2 and the peripheries thereof. This allows the capacitance wiring line CSL2 to also act as the light-shielding film 24b. The capacitance wiring line CSL2 is formed linearly extending along the gate electrode wiring line GL. The decrease in aperture ratio caused by the capacitance wiring line CSL2 can be alleviated by forming the capacitance wiring line CSL2 in a position that overlaps the bottom of the gate electrode wiring line GL as such.

In the examples shown in FIGS. 11 and 12, the capacitance wiring line CSL2 also acts as the light-shielding film 24b, but the capacitance wiring line CSL1 can also act as the light-shielding film 24b.

(Operation Example of Signal Adjusting Part 15c)

The signal adjusting part 15c adjusts the frame frequency on the basis of each detection result from the temperature sensor TS and the optical sensor OS, as described above. The leakage current of the thin-film transistors T1 and T2 in the switching circuit 18 of each pixel changes depending on the usage environment of the liquid crystal panel 2, or in other words, the surrounding temperature and external light. Therefore, the signal adjusting part 15c identifies leakage current of the thin-film transistors T1 and T2 on the basis of each detection result from the temperature sensor TS and optical sensor OS. The signal adjusting part 15c can lower the frame frequency within a range in which the display images in the liquid crystal panel 2 will not change by adjusting the frame frequency, on the basis of identified results of this leakage current.

If the data that expresses a correspondence relationship between the detection values of the sensors and the frame frequency is recorded in a look-up table or the like in advance, then the signal adjusting part 15c can refer to this data to determine a frame frequency corresponding to the detection results of the sensors, for example. The signal adjusting part 15c can adjust the frame frequency to be high enough to match the temperature detected by the temperature sensor TS, for example. The signal adjusting part 15c can also adjust the frame frequency to be high enough to match the intensity of the light detected by the optical sensor OS.

The signal adjusting part 15c can also adjust the amount of change in the voltage applied to the second capacitance Cs2 during the holding period, and the timing of the change, based on the detection results of the sensors. The frequency (the gradation of voltage) of change in the voltage during the holding period can be changed depending on the detection results of the sensors, for example. The signal adjusting part 15c can adjust the frequency to be higher or the amount of change in voltage to be larger in order to match the temperature detected by the temperature sensor TS or the intensity of the light detected by the optical sensor OS. In a similar manner, in this case if data is recorded in advance that expresses a correspondence relationship between the detection values of the sensors and the amount of change or frequency of change in voltage applied to the capacitance Cs2, then the signal adjusting part 15c can refer to this data to control the voltage of the capacitance Cs2 in accordance with the detection results of the sensors.

In this way, by the signal adjusting part 15c adjusting the frame frequency of the display images and/or the voltage control of the capacitance Cs2 on the basis of each detection result of the sensors and/or the inputted image signals, it is possible to suitably adjust the frame frequency to be displayed by the liquid crystal panel (display part) 2 and/or the voltage control of the capacitance Cs2. As a result, the liquid crystal display device 1 having excellent display performance can be configured with ease.

The signal adjusting part 15c can also adjust the frame frequency and control voltage for the capacitance Cs2 on the basis of the image signals. The signal adjusting part 15c may be configured such that the frame frequency is set to a low frequency less than or equal to the prescribed frequency when the display image (image signal) is a still image, and set to a high frequency greater than or equal to a second prescribed frequency (50 Hz, for example) when the display image is a moving image, for example.

In this way, the signal adjusting part 15c adjusts the frame frequency to be less than or equal to a prescribed frequency in accordance with the inputted image signal, enabling a reduction in power consumption of the liquid crystal panel (display part) 2. Thus, a reduction in power consumption of the liquid crystal display device 1 is possible.

Embodiment 2

Figure 13:
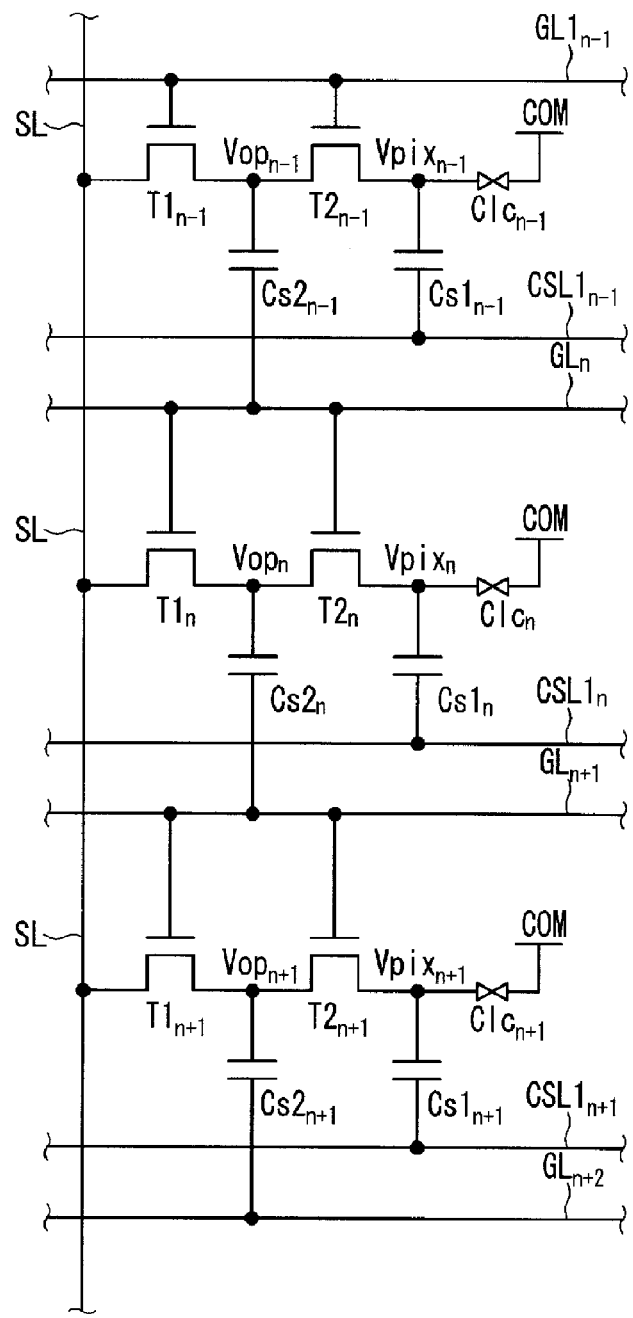
FIG. 13 is a circuit diagram showing an example of an equivalent circuit of a switching circuit in Embodiment 2.

FIG. 13 is a circuit diagram showing an example of an equivalent circuit of a switching circuit in Embodiment 2. In FIG. 13, three switching circuits are shown arranged in the vertical direction among the switching circuits on an active matrix substrate 5.

The three switching circuits shown in FIG. 13 share a source electrode wiring line SL that extends in the vertical direction. A second capacitance wiring line CSL2 of each switching circuit acts as a gate electrode wiring line GL of an adjacent switching circuit in the vertical direction. In other words, the second capacitance wiring line CSL2n connected to second capacitances Cs2n of the switching circuits on one row in a matrix of the active matrix substrate 5 also acts as a gate electrode wiring line GLn+1 that supplies ON/OFF control signals for thin-film transistors T1n+1 and T2n+2 in switching circuits in an adjacent row.

In Embodiment 1 described above, the second capacitance wiring line CSL2, which was only a control signal wire, was connected to the second capacitance Cs2. In contrast, in the present embodiment, Cs2n is connected to the next gate electrode wiring line GLn+1. This allows the wiring line connected to Cs2 to be omitted, and the aperture ratio of the pixels can be made larger than in Embodiment 1.

Figure 14:
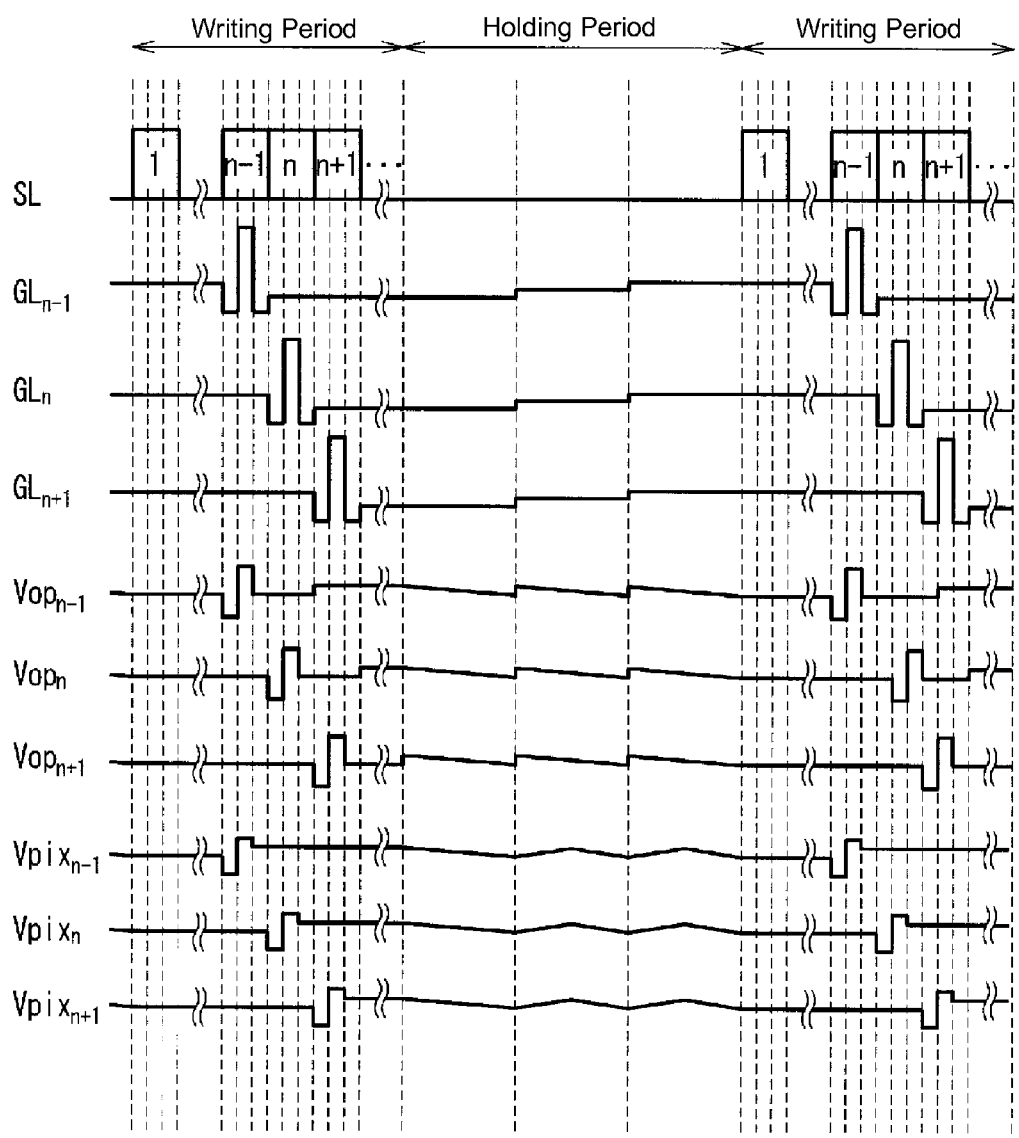
FIG. 14 is a view showing an example of signal waveforms when the circuits shown in FIG. 13 are driven.

FIG. 14 is a view showing an example of signal waveforms when the circuits shown in FIG. 13 are driven.

In the example shown in FIG. 14, the gate electrode wiring lines GLn-1, GLn, GLn+1 apply, at the respective writing time of each, a voltage to turn ON thin-film transistors T1n-1, T1n, T1n+1, T2n-1, T2n, and T2n+1, and also apply a voltage such that the voltages Vopn-2, Vopn-1, and Vopn of respective nodes connected via second capacitances Cs2n-2, CS2n-1, CS2n in one row above are a prescribed voltage. In the holding period, the voltage is changed such that Vop≥Vpix immediately after the voltage of CSL2 is changed in one or more gradation voltages, in a similar manner to the voltage control of the second capacitance wiring line CSL2 in Embodiment 1 described above. In this way, it is possible to realize a driving that is similar to Embodiment 1 by sending signals as shown in FIG. 14 to the gate electrode wiring lines GL.

In the present embodiment, the gate electrode wiring lines GL also act as the second capacitance wiring lines CSL2, so the capacitance driver 21 shown in FIG. 2 can be omitted.

Embodiment 3

Figure 15:
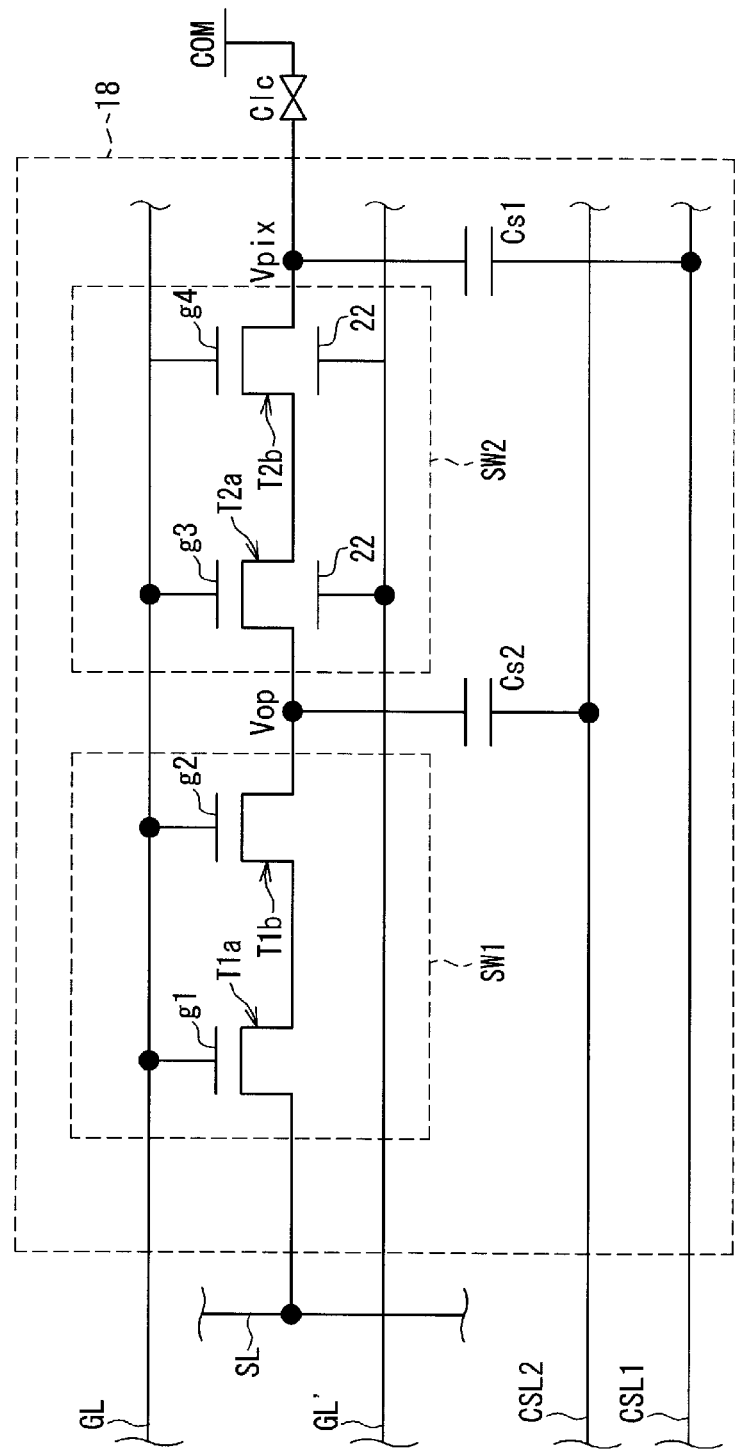
FIG. 15 is a circuit diagram showing an example of an equivalent circuit of a switching circuit 18 in Embodiment 3.

FIG. 15 is a circuit diagram showing an example of an equivalent circuit 18 of a switching circuit in Embodiment 3. In the example shown in FIG. 15, the switching circuit 18 has a plurality (four in the present example) of thin-film transistors T1a, T1b, T2a, and T2b connected in series. A pixel electrode and source electrode wiring line SL are connected via the respective sources and drains of these plurality of thin-film transistors T1a, T1b, T2a, and T2b. In other words, the pixel electrode is connected to one end of the thin-film transistors T1a, T1b, T2a, and T2b, and the source electrode wiring line SL is connected to the other end.

The thin-film transistors T1a and T1b form a first switching part SW1, and the thin-film transistors T2a and T2b form a second switching part SW2. One electrode of a first capacitance Cs1 is connected to a connecting point of the second switching part SW2 and the pixel electrode. The other electrode of the first capacitance Cs1 is connected to a first capacitance wiring line CSL1. One electrode of a second capacitance is connected to a connecting point of the first switching part SW1 and the second connecting part SW2. The other electrode of the second capacitance Cs2 is connected to a second capacitance wiring line CSL2.

In the switching circuit 18, gate electrodes g1, g2, g3, and g4, which are top gate electrodes of respective thin-film transistors T1a, T1b, T2a, and T2b, respectively, are connected to the gate electrode wiring line GL. A transistor with a double-gate structure having a top-gate electrode (gate electrode g3 or g4) and a bottom gate electrode 22 is used for each thin-film transistor T2a and T2b of the second switching part SW2. This bottom gate electrode 22 is connected to a bottom gate electrode wiring line GL'. In contrast to two gate electrodes g3 and g4, a single integrally formed electrode can be used for this bottom gate electrode 22. The bottom gate electrode 22 can also be configured to function as a (lower) light-shielding film that blocks illumination light from a backlight device 3. By connecting the lower light-shielding film 24b shown in FIGS. 9 and 10(a) to the bottom gate electrode wiring line GL', the bottom gate electrode can also act as a light-shielding film, for example.

In the present embodiment as described above, a double-gate structure transistor is used for the thin-film transistors T2a and T2b in the second switching part SW2. This makes it easy to increase the current driving force (the ON current) of the second switching part SW2. Since the ON current can be increased with ease as such, the charging time for the liquid crystal capacitance Clc can be easily reduced.

Effects of the Embodiments

In general, the portions in the liquid crystal display device with the pixel electrodes will be areas that allow light to pass through, so the larger the proportion of the pixel electrode with respect to the total area of the pixel is, the brighter the image that can be obtained. However, the area the pixel electrode occupies becomes smaller due to the gate electrode wiring line, source electrode wiring line, and thin-film transistor placed in the pixel. In addition, in small to medium-sized liquid crystal display panels, namely in mobile phones and smartphones, there is a tendency for the aperture area to be even smaller if the pixels are disposed at a higher resolution.

Meanwhile, memory functions have been added to pixels such as DRAM and SRAM schemes, pixel voltage refresh functions, and the like, which are conventionally adopted as a low frequency circuit driving technology for reducing power consumption. However, these schemes have trouble with full-color display, have a large amount of added elements, and have a clear decrease in pixel aperture ratio. Accordingly, it is very difficult to obtain a low frequency circuit driving technology that achieves high aperture ratio and full-color display.

The pixel circuit in Embodiments 1 and 2 described above can achieve a high aperture ratio because the configuration is simple, with only a light-shielding film, capacitance Cs2, and capacitance wiring line CSL2 additionally provided in the pixel circuit. As shown in FIG. 4, the voltage value of the signal given to CSL2 changes one or more times in the holding period of the pixel voltage, thereby allowing changes in voltage of Vop shown in FIG. 3 to be suppressed. As a result, changes in pixel voltage can also be suppressed, and thus low frequency driving can be achieved. Since this is a simple method that only suppresses off-leak current in the thin-film transistors, it is also possible to achieve full-color display. In other words, according to the embodiments described above, a display can be obtained that simultaneously satisfies the three aspects considered hard to conventionally achieve, i.e., low frequency driving, full-color display, and high aperture ratio.

The loss over time of the electric charge written to the pixel due to the off-leakage current of the transistor can be suppressed even in pixel circuits that use thin-film transistors with large off-leakage currents, such as transistors using polysilicon, for example. As a result, a favorable display can be maintained even with a decrease in driving frequency of the display and lower power consumption.

Other Modification Examples

All of the above-mentioned embodiments are illustrative and not limiting. The technical scope of the present invention is defined by the claims, and any modifications within a scope that corresponds to the configurations stated in the claims and their equivalents are also encompassed by the present invention.

In the descriptions above, the present invention was illustratively described as being applied to a pixel electrode switching circuit used in an active matrix substrate of a liquid crystal display device, for example. However, there are no limitations as long as the semiconductor device of the present invention has a plurality of switching elements that are connected in series, a first capacitance in which one electrode is connected to one end of the plurality of switching elements and the other electrode is connected to a first capacitance wiring line, a second capacitance in which one electrode is connected to a node between the adjacent thin-film transistors and the other electrode is connected to a second capacitance wiring line, and a light-shielding film that blocks light from being incident on at least one of the plurality of switching elements.

Specifically, the present invention can be applied to various types of display devices such as a transflective or reflective liquid crystal panel or organic EL element, an inorganic EL element, or a field emission display, and to active matrix substrates and the like used with these, for example. In addition to the pixel electrode switching circuit, the semiconductor device of the present invention can also be applied to switching circuits and the like used in peripheral circuits such as driver circuits. The number of the switching parts connected in series is not restricted to 2 or 3 as described above.

In the above descriptions, one or two of an n-type transistor was described as being used as the switching element for the switching part, but the switching element of the present invention is not limited to this, and can use a single element in which the n-type transistor and p-type transistor are connected in parallel as the switching element, for example.

However, as in each embodiment described above, it is preferable to use a MIS (Metal-Insulator-Semiconductor) transistor as the switching element of the switching part because the configuration of the switching part can be simplified and the semiconductor device can be formed with ease.

In the above descriptions, a configuration was described in which the signal adjusting part uses either a detection result from a temperature sensor or optical sensor, or an inputted image signal to adjust a frame frequency, but the signal adjusting part of the present invention is not limited to this, as long as the frame frequency is adjusted on the basis of at least one of either a detection result from a sensor that detects the status of the surrounding environment of a display part, or an inputted image signal. In other words, the signal adjusting part of the present invention may identify the size of leakage current in the switching circuit on the basis of detection results from the temperature sensor about the surrounding temperature of the display part, detection results from the optical sensor about the external light around the display part, and also inputted image signals, and then suitably adjust the frame frequency.

In the above descriptions, an upper light-shielding film was described as being formed by a conductor and being electrically connected to a gate electrode wiring line, but the upper light-shielding film of the present invention is not limited to this, and may be in a floating state not electrically connected to a gate electrode wiring line, or formed by a non-conductor, for example. However, as in each embodiment described above, it is preferable for the upper light-shielding film to be electrically connected to a gate electrode wiring line when forming the upper light-shielding film in the same layer as a source electrode and drain electrode.

In the above descriptions, a lightly doped drain region (LDD region) was described as being in a silicon layer (semiconductor layer) that forms a storage capacitance (a capacitance), but the capacitance of the present invention is not limited to this, and a channel region may be used instead of the lightly doped drain region, for example.

In the above descriptions, the use of a transistor with a top-gate electrode structure was described, but a transistor with a bottom-gate electrode structure (an inverted staggered structure) may be used, and a light-shielding film in this case may be formed above the transistor. This transistor may not only be a polycrystalline silicon transistor but also a microcrystalline silicon or amorphous silicon transistor.

In the above descriptions, a bottom gate electrode was described as being used as a (lower) light-shielding film, but the present invention is not limited to this. Specifically, a transparent electrode may be used to form a bottom gate electrode, and a light-shielding film may be provided below the bottom gate electrode below the semiconductor layer. In such a configuration, a light-shielding film made of a non-conductor can be used.

INDUSTRIAL APPLICABILITY

The present invention is useful for a semiconductor device that can reliably suppress leakage current and that can suppress changes in voltage on one end of a plurality of switching parts, even when the plurality of switching parts are connected in series and capacitances are connected to connecting points of the switching parts, an active matrix substrate using this semiconductor device, and a display device.

The invention claimed is:

1. A method of driving a semiconductor device that includes:
   a plurality of switching elements that are connected in series;
   a first capacitance having one electrode connected to an end of the plurality of switching elements and another electrode being connected to a first capacitance wiring line;
   a second capacitance having one electrode connected to a node that connects two adjacent switching elements among the plurality of switching elements, and another electrode being connected to a second capacitance wiring line; and
   a light-shielding film that blocks light from being incident on at least one of the plurality of switching elements, the method comprising:
   turning OFF each switching element between the first capacitance and the second capacitance; and
   when each switching element between the first capacitance and the second capacitance is OFF, changing a voltage of the second capacitance wiring line such that a difference in potential between said one electrode of the first capacitance and said one electrode of the second capacitance is reduced.

2. The method according to claim 1, wherein the step of changing the voltage of the second capacitance wiring line includes, when each switching element between the first capacitance and second capacitance is OFF, changing the voltage of the second capacitance wiring line such that a voltage on said one electrode of the second capacitance becomes higher than a voltage on said one electrode of the first capacitance.

3. The method according to claim 1, wherein the voltage on said one electrode of the second capacitance is lower than the voltage on said one electrode of the first capacitance immediately before the step of changing the voltage of the second capacitance wiring line.

4. The method according to claim 1, wherein in the step of changing the voltage of the second capacitance wiring line, when each switching element between the first capacitance and the second capacitance is OFF, a voltage of the second capacitance wiring line is changed two or more times at set intervals during which said each switching element is OFF.

5. The method according to claim 1, wherein in the step of changing the voltage of the second capacitance wiring line, when each switching element between the first capacitance and the second capacitance is OFF, the voltage of the second capacitance wiring line is changed in the same amount two or more times.

* * * * *